United States Patent
Yoshida et al.

(10) Patent No.: US 8,501,391 B2
(45) Date of Patent: Aug. 6, 2013

(54) PHOTOSENSITIVE RESIN COMPOSITION, FLEXOGRAPHIC PRINTING PLATE, AND METHOD FOR PRODUCING FLEXOGRAPHIC PRINTING PLATE

(75) Inventors: Masahiro Yoshida, Tokyo (JP); Shusaku Tabata, Tokyo (JP)

(73) Assignee: Asahi Kasei E-Materials Corporation, Tokyo (JP)

(*) Notice: Subject to any disclaimer, the term of this patent is extended or adjusted under 35 U.S.C. 154(b) by 292 days.

(21) Appl. No.: 12/665,685

(22) PCT Filed: Jun. 18, 2008

(86) PCT No.: PCT/JP2008/061150
§ 371 (c)(1),
(2), (4) Date: Dec. 18, 2009

(87) PCT Pub. No.: WO2008/156115
PCT Pub. Date: Dec. 24, 2008

(65) Prior Publication Data
US 2010/0189960 A1    Jul. 29, 2010

(30) Foreign Application Priority Data

Jun. 18, 2007 (JP) ................................ 2007-159741

(51) Int. Cl.
*G03F 7/035* (2006.01)
*G03F 7/028* (2006.01)
*G03F 7/00* (2006.01)
*G03C 1/00* (2006.01)
*C08F 2/50* (2006.01)

(52) U.S. Cl.
USPC ............ 430/284.1; 430/283.1; 430/280.1; 430/270.1; 522/90; 522/96; 522/97; 522/113; 522/114; 522/120; 522/151; 522/152; 522/173; 522/174

(58) Field of Classification Search
USPC ............... 522/90, 96, 97, 113, 114, 120, 121, 522/151, 152, 173, 174; 430/284.1, 283.1, 430/280.1, 270.1
See application file for complete search history.

(56) References Cited

U.S. PATENT DOCUMENTS

| | | | | |
|---|---|---|---|---|
| 5,336,585 A | * | 8/1994 | Takahashi et al. | 430/284.1 |
| 5,837,422 A | * | 11/1998 | Sasaki et al. | 430/284.1 |
| 5,856,066 A | | 1/1999 | Yoshida et al. | |
| 6,399,277 B1 | | 6/2002 | Nojima et al. | |
| 6,403,284 B1 | * | 6/2002 | Yoshida | 430/309 |
| 7,374,863 B2 | | 5/2008 | Sugasaki et al. | |
| 2005/0170285 A1 | | 8/2005 | Sugasaki et al. | |

FOREIGN PATENT DOCUMENTS

| | | |
|---|---|---|
| CN | 1651512 A | 8/2005 |
| EP | 0 323 563 | 7/1989 |
| EP | 0 691 357 A1 | 1/1996 |
| EP | 0 756 204 | 1/1997 |
| EP | 1 020 766 B1 | 5/2007 |
| JP | 60-173055 | 9/1985 |
| JP | 03157657 A * | 7/1991 |
| JP | 4-95959 | 3/1992 |
| JP | 8-169925 | 7/1996 |
| JP | 9-288356 | 11/1997 |
| JP | 10-20493 | 1/1998 |
| JP | 2000-128957 | 5/2000 |
| JP | 2000-26677 | 7/2000 |
| JP | 2001-215697 | 8/2001 |
| JP | 2001-342232 | 12/2001 |
| JP | 3592336 | 9/2004 |
| JP | 2004-317660 | 11/2004 |
| JP | 2004-341286 | 12/2004 |
| WO | WO-98/25184 | 6/1998 |

OTHER PUBLICATIONS

International Preliminary Report on Patentability (PCT/JP2008/061150), dated Jan. 7, 2010.
Office Action dated Jun. 2, 2011 issued in a corresponding Chinese Application.
Kudo, "Hybrid Type Hyperbranched Polymer*Synthesis and Properties of Photofunctional Hyperbranched Polymer", Kobunshi, The Society of Polymer Science, vol. 56, pp. 334-337, (May 2007).
International Search Report from the Japanese Patent Office for International Application No. PCT/JP2008/061150 (Jul. 15, 2008).
European Search Report for Counterpart EP Application No. 08765717.7-2222 dated Aug. 20, 2012.

* cited by examiner

Primary Examiner — Sanza McClendon
(74) Attorney, Agent, or Firm — Finnegan, Henderson, Farabow, Garrett & Dunner, L.L.P.

(57) ABSTRACT

The present invention provides a photosensitive resin composition comprising 100 parts by mass of a polyurethane prepolymer having an ethylenically unsaturated group, 10 to 150 parts by mass of an ethylenically unsaturated compound, and 0.01 to 10 parts by mass of a photopolymerization initiator, wherein the ethylenically unsaturated compound comprises 0.1 to 10 parts by mass of a polyfunctional ethylenically unsaturated compound having 6 or more (meth)acryloyl groups in a molecule thereof with respect to 100 parts by mass of the polyurethane prepolymer.

28 Claims, No Drawings

PHOTOSENSITIVE RESIN COMPOSITION, FLEXOGRAPHIC PRINTING PLATE, AND METHOD FOR PRODUCING FLEXOGRAPHIC PRINTING PLATE

TECHNICAL FIELD

The present invention relates to a photosensitive resin composition, a flexographic printing plate, and a method for producing a flexographic printing plate.

BACKGROUND ART

Photosensitive resin printing plates general as plate materials for flexographic printing are formed as follows. First, a solid or liquid photosensitive resin as a raw material is irradiated with active light, and only photosensitive layers of relief portions are cured by a radical polymerization reaction (exposure process). Then, uncured resin except the relief portions is dissolved and removed with a predetermined wash out solution (developing solution), or swollen and dispersed and mechanically removed (development process). This forming method is one for making cured portions only emerging on the plate surface as a relief. The forming method is preferably used because of being capable of forming a fine relief in a short time.

Among them, the method of using a liquid photosensitive resin takes only a short time required for producing printing plates and can cope with short delivery times. The method can also reduce production costs because of being capable of recovering and reutilizing uncured resin. Using the method further gives a favorable flexibility to the surface of printing plates formed. From these points, the method using a liquid photosensitive resin widely spreads.

In the case of printing on the surface of corrugated board sheets, printing plates formed using a liquid photosensitive resin, that is, liquid photosensitive resin printing plates, are preferably used. Corrugated board sheets typically have a structure in which liners (paper boards) are laminated on a corrugating medium, or a structure laminated from the former structures. The printing surface of the sheets has a corrugating shape due to the presence of the corrugating medium, and the sheets themselves are flexible due to the hollow structure. Hence, liquid photosensitive resin printing plates having a favorable flexibility are preferably used.

A producing process of corrugated boards distributed as products commonly contains a sheet producing step, a printing step, a die cutting step, a box making step, and the like. Major corrugated board manufacturers performing integrally these steps have a problem caused by paper pieces and paper dusts in some cases. In the sheet producing step in the corrugated board producing process, paper pieces and paper dusts are liable to be generated. Adhering of the generated paper pieces and paper dusts to plate surfaces of printing plates in the printing step causes printing defects (spoilage). In order to remove the paper pieces and paper dusts adhered to plate surfaces, printing must be suspended. These problems lead to an increase in working hours, a decrease in productivity, and an increase in production costs.

Moreover, since the mix rate of recycled raw materials such as newspaper and used paper for base papers used for corrugated boards has recently increased year by year, the amount of paper pieces and paper dusts generated in production sites increases. The printing quality demanded for corrugated board cases to package beverages, electric household appliances and the like has recently been raised increasingly. Under such a situation, a liquid photosensitive resin printing plate capable of reducing the influence of problems caused by paper pieces and paper dusts is demanded in corrugated board printing.

In the case of obtaining a flexible printing plate demanded for corrugated board printing from a liquid photosensitive resin, relief portions insolubilized to a developing solution by a photoradical reaction often leave portions remaining such as those having a relatively low polymerization degree, those having a high residual ratio of unreacted monomers and those having a loose crosslinking structure. Such portions bring tackiness on relief surfaces. Again irradiating a relief after development having such portions with active light (post-exposure) enables to reduce the tackiness.

Patent Document 1 describes a liquid photosensitive resin composition in which a polyurethane (meth)acrylate prepolymer based on an amine-modified polyether is blended with benzophenone. The patent document describes a technology in which such a liquid photosensitive resin composition is subjected to an exposure and development treatment, and thereafter, is irradiated with germicidal radiation to make relief surfaces nontacky.

Patent Document 2 describes a liquid photosensitive resin composition composed of a polyurethane prepolymer containing a specific benzoic acid derivative as a tackiness-reducing additive. The patent document describes a technology in which such a liquid photosensitive resin composition is subjected to an exposure and development treatment, and thereafter, is irradiated with germicidal radiation to make relief surfaces nontacky.

Patent Document 3 proposes a method of making nontacky surfaces of many flexographic printing plates obtained by a producing method containing a wash out (development) step and a post-exposure step. The method involves using a wash out solution containing a hydrogen abstracting agent (for example, benzophenone). The patent document describes a technology in which uncured resin is washed away using such a wash out solution, and thereafter, the surfaces of flexographic printing plate reliefs are irradiated with a radiation to activate the hydrogen abstracting agent, for example, germicidal light or the like for benzophenone, to make the surfaces nontacky.

Meanwhile, the relief depth of printing plates used especially in corrugated board printing often reaches 2 mm or more. Such a relief is liable to break, that is, to cause plate chipping.

Under such a situation, Patent Document 4 describes a flexographic printing plate achieving a notch cracking resistance of 20 sec. or more. The notch cracking resistance is an index of the durability required in corrugated board printing. Such a flexographic printing plate is formed of a specific liquid photosensitive resin composition containing a urethane prepolymer composed of a mixture of a polyether polyol and a polyester polyol, a monofunctional monomer, and a polyfunctional monomer.

Patent Document 1: Japanese Patent Application Laid-Open No. 08-169925
Patent Document 2: Japanese Patent Application Laid-Open No. 2000-206677
Patent Document 3: Japanese Patent Application Laid-Open No. 09-288356
Patent Document 4: Japanese Patent Application Laid-Open No. 04-95959

DISCLOSURE OF THE INVENTION

Problems to be Solved by the Invention

However, even in the case of using flexographic printing plates described in Patent Documents 1 to 3, in repeating printing under a relatively high printing pressure condition as in corrugated board printing, relief surfaces often abrade. The abraded relief surfaces have a high tackiness in some cases. The relief surfaces having a high tackiness are liable to cause the above-mentioned problems caused by paper pieces and paper dusts.

A flexographic printing plate described in Patent Document 4 is a urethane prepolymer containing a polyester polyol, but since such a polymer generally has a high tackiness originated from the ester bonds, problems caused by paper pieces and paper dusts are liable to be caused.

Hence, a flexographic printing plate is industrially desired which has a favorable notch cracking resistance, and can maintain a low tackiness even in the case of being used repeatedly in printing.

The present invention has been achieved in consideration of the above-mentioned situation, and has an object to provide a flexographic printing plate which has a favorable notch cracking resistance, and can maintain a low tackiness of relief surfaces even in the case of being used repeatedly in printing, a photosensitive composition which can accomplish the flexographic printing plate, and a method for producing a flexographic printing plate.

Means for Solving the Problems

As a result of exhaustive studies to solve such problems, the present inventors have found that a specific photosensitive resin composition having a specific polyfunctional ethylenically unsaturated compound can solve the above-mentioned problems. This finding has led to the completion of the present invention.

That is, the present invention provides a photosensitive resin composition, a flexographic printing plate and a method for producing a flexographic printing plate described below.

[1] A photosensitive resin composition comprising 100 parts by mass of a polyurethane prepolymer having an ethylenically unsaturated group, 10 to 150 parts by mass of an ethylenically unsaturated compound, and 0.01 to 10 parts by mass of a photopolymerization initiator, wherein the ethylenically unsaturated compound comprises 0.1 to 10 parts by mass of a polyfunctional ethylenically unsaturated compound having 6 or more (meth)acryloyl groups in a molecule thereof with respect to 100 parts by mass of the polyurethane prepolymer.

[2] The photosensitive resin composition according to [1], wherein the polyfunctional ethylenically unsaturated compound has 6 or more acryloyl groups in a molecule thereof.

[3] The photosensitive resin composition according to [1] or [2], wherein the polyfunctional ethylenically unsaturated compound comprises a compound represented by the general formula (1) shown below:

[Formula 1]

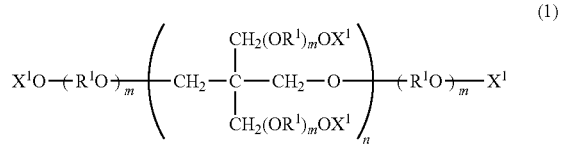

wherein $R^1$ denotes a divalent aliphatic saturated hydrocarbon group; $X^1$ denotes a (meth)acryloyl group, a hydrogen atom, or a monovalent aliphatic saturated hydrocarbon group; and m denotes an integer of 0 or 1 or more, and n denotes an integer of 2 or more; here, a plurality of $X^1$ may be the same or different, and 6 or more of them denotes (meth)acryloyl groups.

[4] The photosensitive resin composition according to any one of [1] to [3], wherein the polyfunctional ethylenically unsaturated compound comprises one or two or more compounds selected from the group consisting of dipentaerythritol hexa(meth)acrylate, tripentaerythritol hepta(meth)acrylate, tripentaerythritol octa(meth)acrylate, and ethyleneoxide adducts and/or propyleneoxide addition products thereof.

[5] The photosensitive resin composition according to any one of [1] to [4], wherein the polyfunctional ethylenically unsaturated compound comprises a urethane-based polyfunctional ethylenically unsaturated compound obtained by reacting a polyisocyanate with (meth)acrylating agents.

[6] The photosensitive resin composition according to any one of [1] to [5], wherein the polyfunctional ethylenically unsaturated compound comprises a compound represented by the general formula (2) shown below:

[Formula 2]

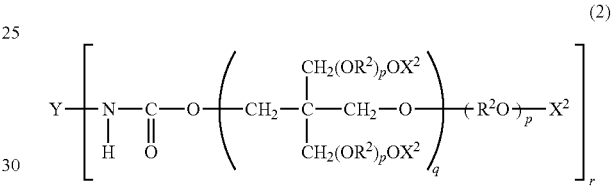

wherein $R^2$ denotes a divalent aliphatic saturated hydrocarbon group; $X^2$ denotes a (meth)acryloyl group, a hydrogen atom, or a monovalent aliphatic saturated hydrocarbon group; Y denotes a polyisocyanate residue; and p denotes an integer of 0 or 1 or more, q denotes an integer of 0 or 1 or more, and r denotes an integer of 2 or more; here, a plurality of $X^2$ may be the same or different, and 6 or more of them denotes (meth)acryloyl groups.

[7] The photosensitive resin composition according to any one of [1] to [6], wherein the polyfunctional ethylenically unsaturated compound comprises a (meth)acryl compound having a urethane bond synthesized from one or two or more isocyanate compounds selected from the group consisting of tolylene diisocyanate, hydrogenated diphenylmethane diisocyanate, hexamethylene diisocyanate, isophorone diisocyanate, tolylene triisocyanate, triphenylmethane triisocyanate, 1,6,11-undecane triisocyanate, 1,3,6-hexamethylene triisocyanate, and hexamethylene diisocyanate trimer.

[8] The photosensitive resin composition according to any one of [1] to [7], wherein the polyurethane prepolymer comprises a polyether polyester-based polyurethane prepolymer.

[9] The photosensitive resin composition according to any one of [1] to [8], wherein the polyether polyester-based polyurethane prepolymer comprises a prepolymer obtained by reacting a reaction product of a polyol mixture containing a polyether polyol and a polyester polyol with a polyisocyanate, with (meth)acrylating agents.

[10] The photosensitive resin composition according to any one of [1] to [9], wherein the polyfunctional ethylenically unsaturated compound comprises a compound having a hyperbranched structure and/or a (meth)acrylate of a polyhydric alcohol.

[11] A flexographic printing plate comprising a cured product of a photosensitive resin composition according to any one of [1] to [10].

[12] A method for producing a flexographic printing plate, comprising: the cured site formation step of exposing a surface of a body formed from a photosensitive resin composition according to any one of [1] to [10] to form a cured site within the surface of the formed body; the development step of developing the cured site with a wash out solution; and the active light irradiation step of irradiating a surface of the developed cured site with active light.

[13] The method according to [12], wherein the wash out solution comprises a photosensitive hydrogen abstracting agent.

[14] The method according to [12] or [13], wherein the active light has a distribution in a wavelength region of 200 nm to 300 nm; and the photosensitive hydrogen abstracting agent comprises benzophenone or a derivative thereof.

Effect Of The Invention

The present invention provides a flexographic printing plate which has a favorable notch cracking resistance, and maintains a low tackiness of the relief surface even in the case of being repeatedly used for printing, a photosensitive composition capable of accomplishing the flexographic printing plate, and a method for producing a flexographic printing plate.

BEST MODE FOR CARRYING OUT THE INVENTION

Hereinafter, the best mode (hereinafter, referred to as "the embodiment") for carrying out the present invention will be described in detail. The present invention is not limited to the embodiment described below, and various changes and modifications may be made within the gist of the present invention.

In the present description, "(meth)acryl" is a concept including "acryl" and "methacryl"; similarly, "(meth)acryloyl" is a concept including "acryloyl" and "methacyloyl", and "(meth)acrylate" is a concept including "methacrylate" and "acrylate".

[A Photosensitive Resin Composition, and a Flexographic Printing Plate]

A photosensitive resin composition according to the embodiment comprises components (a) to (c) described below, that is, (a) a polyurethane prepolymer having an ethylenically unsaturated group, (b) an ethylenically unsaturated compound, and (c) a photopolymerization initiator.

A mode of a photosensitive resin composition according to the embodiment is preferably to be liquid (that is, a photosensitive resin composition according to the embodiment is a liquid photosensitive resin composition). Hence, there are obtained such an advantage that uncured resin can be recovered and reutilized, and such an advantage on productivity and working environments that the composition can be developed with an aqueous wash out solution.

The viscosity at room temperature of a photosensitive resin composition according to the embodiment is preferably in the range of 10 to 500 Pas from the viewpoint of developing an excellent thickness precision by using the composition in a producing method of a flexographic printing plate described later. The viscosity is more preferably in the range of 20 to 300 Pas. The viscosity is a viscosity at 20° C., and is a value measured using a commercially available viscometer, for example, a B type viscometer, model B8H (made by Tokyo Keiki Co., Ltd.).

The polyurethane prepolymer of the component (a) has a plurality of urethane bonds in its molecule, and has an ethylenically unsaturated group, and is a compound bondable with another compound by a polymerization reaction.

Producing methods of such a component (a) include those of (i) and (ii) as follows.

(i) A method in which a polyol and a polyisocyanate are reacted to first form a polyurethane having isocyanate groups at its terminals in an optional molecular weight, and then, the polyurethane and a compound having an active hydrogen and an ethylenically unsaturated group in its molecule are reacted.

(ii) A method in which a polyol and a polyisocyanate are reacted to first form a polyurethane having hydroxyl groups at its terminals in an optional molecular weight, and then, the polyurethane and a compound having an isocyanate group and an ethylenically unsaturated group in its molecule are reacted.

The polyols include, for example, polyether polyols, polyester polyols, polyether polyester copolymerized polyols and hydrogenated polybutadiene polyols. These are used singly or in combination of two or more.

The polyether polyols include, for example, polyoxyethylene glycols, polyoxypropylene glycols, polyoxytetramethylene glycols, poly 1,2-butylene glycols, polyoxyethylene/polyoxypropylene random copolymers, polyoxyethylene/polyoxypropylene block copolymers, polyoxyethylene/polyoxytetramethylene random copolymers and polyoxyethylene/polyoxytetramethylene block copolymers. These are used singly or in combination of two or more.

The polyester polyols include condensed polyester polyols, that is, diols having a recurring unit of a polyester segment obtained by polycondensation reaction of a glycol compound and a dicarboxylic acid compound. Such diols include, for example, adipate diols such as poly(ethylene glycol adipate) diols, poly(diethylene glycol adipate) diols, polypropylene glycol adipate) diols, poly(1,4-butane glycol adipate) diols, poly(1,6-hexane glycol adipate) diols, poly(2-methylpropane glycol adipate) diols, poly(3-methyl-1,5-pentane glycol adipate) diols, poly(neopentyl glycol adipate) diols, poly(1,9-nonane glycol adipate) diols and poly(2-methyloctane glycol adipate) diols, polycaprolactone diols, and poly (β-methyl-δ-valerolactone) diols. The dicarboxylic acid compounds constituting polyester segments include, other than adipic acid, for example, succinic acid, glutaric acid, azelaic acid, sebacic acid, maleic acid, terephthalic acid, isophthalic acid and 1,5-naphthalene dicarboxylic acid. As exemplified above, a polyester segment is typically constituted by a polycondensation reaction of respective single kinds of a diol compound and a dicarboxylic acid compound. However, polyester segments may be constituted by using several kinds of either one or both of the compounds and mixing and polycondensing them in optional proportions. The polyester polyols usable are, other than the above-mentioned condensed polyester polyols, lactone polyester polyols and polycarbonate diols, and these are used singly or in combination of two or more.

The polyether polyester copolymerized polyols include copolymers having a structure in which recurring units forming the molecular chains of the above-mentioned polyether polyols and recurring units of the molecular chains of the above-mentioned polyester polyols are in blocks or randomly bonded. The polyether polyester copolymerized polyols are used singly or in combination of two or more.

The polyisocyanates include, for example, tolylene diisocyanate, xylylene diisocyanate, hexamethylene diisocyanate, trimethylhexamethylene diisocyanate, isophorone diisocyanate and diphenylmethane diisocyanate. These are used singly or in combination of two or more.

The compounds described above having active hydrogen and an ethylenically unsaturated group in their molecules include, for example, hydroxypropyl (meth)acrylate, hydroxyethyl (meth)acrylate, polypropylene glycol mono (meth)acrylate, polyethylene glycol mono(meth)acrylate, glycerol mono(meth)acrylate and glycerol di(meth)acrylate.

The compounds described above having an isocyanate group and an ethylenically unsaturated group in their molecules include, for example, (meth)acryloyloxyethyl isocyanate.

As described above, a compound which can react with molecular terminals of a polyurethane to add (meth)acryl groups are sometimes described as "(meth)acrylating agent" in the present description.

In the present description, a polyurethane prepolymer whose polyol structure is constituted of polyether segments is sometimes described as "polyether-based polyurethane prepolymer"; a polyurethane prepolymer constituted of polyester, "polyester-based polyurethane prepolymer"; and a polyurethane prepolymer constituted of polyether segments and polyester segments, "polyether polyester-based polyurethane prepolymer". Above these all, a polyether polyester-based polyurethane prepolymer is suitable from the viewpoint of developing high flexibility and durability as printing plate reliefs.

The polyether polyester-based polyurethane prepolymer is preferably obtained by reacting a reaction product of a polyol mixture containing a polyether polyol and a polyester polyol with a polyisocyanate, with a (meth)acrylating agent. This polyurethane prepolymer is preferable from the viewpoint of the developability with an aqueous wash out solution, and suitable also from the viewpoint of easily controlling its molecular weight at a predetermined molecular weight.

The number-average molecular weight of the component (a) is preferably 5,000 to 70,000, and more preferably 5,000 to 50,000. Making the number-average molecular weight to be 5,000 or higher is suitable from the viewpoint of providing its polymerized cured product with a favorable mechanical strength, and accomplishing a high durability against the repeating usage and rough handling of flexographic printing plates. Making the number-average molecular weight to be 70,000 or lower is suitable from the viewpoint of providing a photosensitive resin composition with a favorable developability with an aqueous wash out solution, and being easily adaptable to a universal developing apparatus.

In the present description, "number-average molecular weight" refers to a value calculated as a polystyrene-equivalent molecular weight in GPC measurement described in Examples described later.

The component (a) preferably has a proportion of polyoxyethylene segments of 5 to 25% by mass, and more preferably 10 to 20% by mass, from the viewpoint of developing a favorable developability with an aqueous wash out solution. Making the proportion of the polyoxyethylene segments to be 5% by mass or higher may contribute to securing the dispersibility of a composition in an aqueous wash out solution. Making the proportion of that to be 25% by mass or lower may contribute to suppressing the swellability of a cured product of a photosensitive resin composition (hereinafter, referred to as "resin cured product") in a printing ink at a certain value or lower, and suppressing decrease in the printing quality due to swelling of reliefs during printing.

The component (a) described heretofore is used singly or in combination of two or more.

The ethylenically unsaturated compound of the component (b) is a compound having an ethylenically unsaturated group in its molecule, and includes a polyfunctional ethylenically unsaturated compound having 6 or more (meth)acryloyl groups in its molecule. The component (b) includes, for example, unsaturated carboxylic acids such as acrylic acid and methacrylic acid; ester compounds of unsaturated carboxylic acids; (meth)acrylamide and its derivatives; allyl compounds; maleic acid, maleic anhydride, fumaric acid and esters thereof; and other compounds having an ethylenically unsaturated group. These are used singly or in combination of two or more.

The ester compounds of the unsaturated carboxylic acids include, for example, alkyl (meth)acrylates, cycloalkyl (meth)acrylates, halogenated alkyl (meth)acrylates, alkoxyalkyl (meth)acrylates, hydroxyalkyl (meth)acrylates, aminoalkyl (meth)acrylates, tetrahydrofurfuryl (meth)acrylates, allyl (meth)acrylates, glycidyl (meth)acrylates, benzyl (meth)acrylates, and phenoxyethyl (meth)acrylate; alkylene glycol or polyoxyalkylene glycol mono- or di(meth)acrylates; trimethylolpropane tri(meth)acrylate; glycerol mono-, di- or tri(meth)acrylates, pentaerythritol tetra(meth)acrylate, and ditrimethylolpropane tetra(meth)acrylate.

The (meth)acrylamide derivatives include, for example, methacrylamides N-, or N,N'-substituted with alkyl groups or hydroxyalkyl groups, diacetone (meth)acrylamide, and N,N'-alkylene bis(meth)acrylamide.

The allyl compounds include, for example, allyl alcohol, allyl isocyanate, diallyl phthalate, and triallyl cyanurate.

The esters of maleic acid, maleic anhydride and fumaric acid include, for example, alkyl, halogenated alkyl or alokoxyalkyl mono- or dimaleate or mono- or difumarate.

The compounds having other ethylenically unsaturated groups include, for example, styrene, vinyltoluene, divinylbenzene, N-vinylcarbazole, and N-vinylpyrrolidone.

The component (b) is, from the viewpoint of controlling the flexibility and elastic characteristics required for flexographic printing plates, mechanical strengths required for the durability, the swellability in inks, and the like, preferably one or more compounds selected from the group consisting of propylene glycol monomethacrylate, polyoxypropylene glycol monomethacrylate, diethylene glycol monoethyl ether mono(meth)acrylate, diethylene glycol monobutyl ether mono(meth)acrylate, diethylene glycol mono-2-ethylhexyl ether mono(meth)acrylate, triethylene glycol monohexyl ether mono(meth)acrylate, tetradecyl (meth)acrylate, pentadecyl (meth)acrylate, phenoxyethyl (meth)acrylate, N,N-diethylaminoethyl (meth)acrylate and polyoxypropylene glycol di(meth)acrylate.

In a photosensitive resin composition according to the embodiment, the content of the component (b) is 10 to 150 parts by mass, and preferably 10 to 100 parts by mass, with respect to 100 parts by mass of the component (a). Making the content of the component (b) in this range is suitable from the viewpoint of easily accomplishing a viscosity of 10 to 500 Pa·s of a photosensitive resin composition at room temperature, which is desired for obtaining a favorable printing plate processability.

The component (b) includes a polyfunctional ethylenically unsaturated compound having 6 or more (meth)acryloyl groups, preferably 6 to 30 ones, and more preferably 6 to 20 ones, in one molecule. Making the number of the (meth)acryloyl groups to be 6 or more is important from the viewpoint of suppressing tackiness development in the case of repeatedly using produced printing plates and from the viewpoint of accomplishing mechanical properties excellent in durability in handling printing plates.

The molecular weight of the polyfunctional ethylenically unsaturated compound is preferably in the range of 500 to 5,000, and more preferably 500 to 3,000.

Making the number and the molecular weight of the methacryloyl group of the polyfunctional ethylenically unsaturated compound to be in the above-mentioned ranges is preferable from the viewpoint of easily regulating the viscosity of a photosensitive resin composition according to the embodiment in a preferable range and from the viewpoint of easily having a hardness at which produced flexographic printing plates exhibit excellent ink transferability.

The (meth)acryloyl group is important from the viewpoint of achieving a crosslinking structure at an excellent photoradical polymerization rate in a mixture of the ethylenically unsaturated compound with the polyurethane prepolymer having an ethylenically unsaturated group. Especially an acryloyl group is preferable from the viewpoint of suppressing the development of its tackiness at a higher level in the case of repeatedly using produced printing plates obtained from a photosensitive resin composition according to the embodiment.

The polyfunctional ethylenically unsaturated compound is preferably a compound represented by the general formula (1):

[Formula 3]

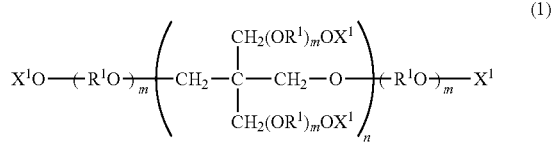

(1)

wherein $R^1$ denotes a divalent aliphatic saturated hydrocarbon group; $X^1$ denotes a (meth)acryloyl group, a hydrogen atom, or a monovalent aliphatic saturated hydrocarbon group; and m denotes an integer of 0 or 1 or more, and n denotes an integer of 2 or more; here, a plurality of $X^1$ may be the same or different, and 6 or more of them denotes (meth)acryloyl groups.

The divalent aliphatic saturated hydrocarbon group represented by $R^1$ in the general formula (1) shown above is preferably an alkylene group. Specifically, the alkylene groups include, for example, an ethylene group, a 1,2-propylene group, a 1,3-propylene group, a tetramethylene group and a 1,2-butylene group. Above these all, an ethylene group and a 1,2-propylene group are preferable.

A monovalent aliphatic saturated hydrocarbon group $X^1$ denotes in the general formula (1) shown above is preferably an alkyl group. The alkyl groups include, for example, straight-chain or branched-chain alkyl groups having 1 to 10, preferably 1 to 8 carbon atoms. More specifically, they include, for example, a methyl group, an ethyl group, a propyl group, an isopropyl group, a butyl group, a hexyl group, an octyl group and a 2-ethylhexyl group.

In the general formula (1) shown above, the value of n is 2 or more, and preferably 2 to 4. In the case of n being 1, a compound represented by the formula (1) cannot have 6 or more (meth)acryloyl groups. By contrast, making the value of n to be 4 or less is suitable from the viewpoint of securing the dispersibility of a polyfunctional ethylenically unsaturated compound in an aqueous wash out solution and from the viewpoint of simultaneously achieving both the flexibility and the durability, which are required for printing plates. In the general formula (1) shown above, the value of m is an integer of 0 or 1 or more, preferably an integer of 0 to 3, and more preferably 0, 2 or 3.

Making the values of m and n in such a range is suitable from the viewpoint of improving the dispersibility of a polyfunctional ethylenically unsaturated compound in an aqueous wash out solution and from the viewpoint of imparting the flexibility to printing plates. Making the value of m to be 3 or less is suitable from the viewpoint of simultaneously satisfying both the durability and the surface abrasion resistance of printing plates.

If the polyfunctional ethylenically unsaturated compound represented by the general formula (1) shown above is a product obtained reacting a polypentaerythritol or an ethylene oxide and/or propylene oxide addition product of a polypentaerythritol with (meth)acrylic acid, it is suitable from the viewpoint of developing effects simultaneously satisfying both the durability and the surface abrasion resistance of printing plates. Such polyfunctional ethylenically unsaturated compounds include, for example, dipentaerythritol hexa(meth)acrylate, tripentaerythritol hexa(meth)acrylate, tripentaerythritol hepta(meth)acrylate, tripentaerythritol octa(meth)acrylate, tetrapentaerythritol hexa(meth)acrylate, tetrapentaerythritol penta(meth)acrylate, tetrapentaerythritol octa(meth)acrylate and ethylene oxide and/or propylene oxide adducts thereof (in the formula (1) shown above, $R^1$ is an ethylene group and/or a propylene group). Above all these, suitably used are one or two or more compounds selected from the group consisting of dipentaerythritol hexa(meth)acrylate, tripentaerythritol hepta(meth)acrylate, tripentaerythritol octa(meth)acrylate and ethylene oxide and/or propylene oxide adducts thereof from the viewpoint of adjusting the viscosity of a resin composition and the hardness of printing plates in appropriate ranges and developing effects simultaneously satisfying both the durability and the surface abrasion resistance of the printing plates. From the same viewpoint, more suitably used are one or two or more compounds selected from the group consisting of dipentaerythritol hexa(meth)acrylate, tripentaerythritol hepta(meth)acrylate and tripentaerythritol octa(meth)acrylate. In the case of using as a polyfunctional ethylenically unsaturated compound a product obtained by reacting an exemplified polypentaerythritol or an ethylene oxide or propylene oxide addition product of the polypentaerythritol with (meth)acrylic acid, the contents of dipentaerythritol hexa(meth)acrylate, and an ethylene oxide and/or propylene oxide adduct thereof are preferably 50 to 100% by mass, and more preferably 60 to 100% by mass.

As the polyfunctional ethylenically unsaturated compound, also a urethane-based polyfunctional ethylenically unsaturated compound is suitably used which is obtained by reacting a polyisocyanate with (meth)acrylating agents being (meth)acryl compounds each having an active hydroxide group.

A specific example of the urethane-based polyfunctional ethylenically unsaturated compound includes a compound represented by the general formula (2) shown below:

[Formula 4]

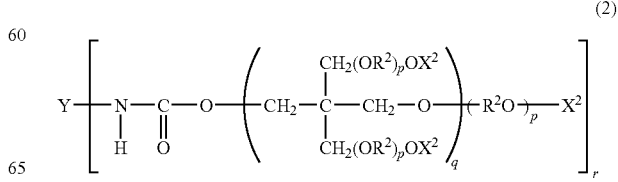

(2)

wherein $R^2$ denotes a divalent aliphatic saturated hydrocarbon group; $X^2$ denotes a (meth)acryloyl group, a hydrogen atom, or a monovalent aliphatic saturated hydrocarbon group; Y denotes a polyisocyanate residue; and p denotes an integer of 0 or 1 or more, q denotes an integer of 0 or 1 or more, and r denotes an integer of 2 or more; here, a plurality of $X^2$ may be the same or different, and 6 or more of them denote (meth)acryloyl groups.

In the general formula (2) shown above, a divalent aliphatic saturated hydrocarbon group $R^2$ denotes is preferably an alkylene group. Specifically, the alkylene groups include, for example, an ethylene group, a 1,2-propylene group, a 1,3-propylene group, a tetramethylene group and 1,2-butylene group. Above these all, an ethylene group and a 1,2-propylene group are preferable. Most preferable is an ethylene group from the viewpoint of securing the dispersibility of a polyfunctional ethylenically unsaturated compound in an aqueous wash out solution.

In the general formula (2) shown above, a monovalent aliphatic saturated hydrocarbon group $X^2$ denotes is preferably an alkyl group. The alkyl groups include, for example, straight-chain or branched-chain alkyl groups having 1 to 10, preferably 1 to 8 carbon atoms. More specifically, they include, for example, a methyl group, an ethyl group, a propyl group, an isopropyl group, a butyl group, a hexyl group, an octyl group and a 2-ethylhexyl group.

In the general formula (2) shown above, a polyisocyanate residue Y denotes is a residue obtained by removing isocyanate groups from a polyisocyanate; for example, in the case of the polyisocyanate being hexamethylene diisocyanate, the residue denotes a hexamethylene group. In the case where Y denotes a polyisocyanate residue, a compound represented by the general formula (2) shown above is a (meth)acryl compound synthesized form a polyisocyanate compound and having urethane bonds.

In the general formula (2) shown above, specific examples of polyisocyanate residues include residues obtained by removing isocyanate groups from tolylene diisocyanate, diphenylmethane diisocyanate, hydrogenated diphenylmethane diisocyanate, p-phenylene diisocyanate, 1,5-naphthalene diisocyanate, tolidine diisocyanate, hexamethylene diisocyanate, trans-cyclohexane 1,4-diisocyanate, xylylene diisocyanate, hydrogenated xylylene diisocyanate, tetramethylxylene diisocyanate, lysine diisocyanate, lysine ester triisocyanate, isophorone diisocyanate, tolylene triisocyanate, triphenylmethane triisocyanate, tris(isocyanate phenyl) thiophosphate, 1,6,11-undecane triisocyanate, 1,8-diisocyanate-4-isocyanate methyloctane, 1,3,6-hexamethylene triisocyanate, bicycloheptane triisocyanate, hexamethylene diisocyanate trimer and a compound represented by the general formula (3) shown below:

[Formula 5]

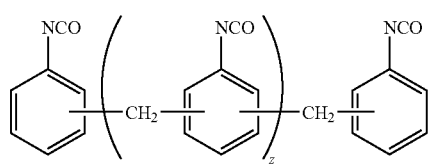

(3)

wherein Z denotes an integer of 1 or more.

Above these all, from the viewpoint of adjusting the viscosity of a resin composition and the hardness of printing plates in appropriate regions, preferable are residues obtained by removing isocyanate groups from tolylene diisocyanate, hydrogenated diphenylmethane diisocyanate, hexamethylene diisocyanate, isophorone diisocyanate, tolylene triisocyanate, triphenylmethane triisocyanate, 1,6,11-undecane triisocyanate, 1,3,6-hexamethylene triisocyanate and hexamethylene diisocyanate trimer.

In the general formula (2) shown above, the value of p is an integer of 0 or 1 or more, and preferably 0 to 3; the value of q is 0 or 1 or more, and preferably 0 to 3. Making the values of p and q in such ranges are suitable from the viewpoint of improving the dispersibility of a polyfunctional ethylenically unsaturated compound in an aqueous wash out solution and imparting the flexibility to printing plates.

In the general formula (2) shown above, the value of r is 2 or more, preferably 2 to 6, and more preferably 2 or 3.

Making the value of r in the range of 2 to 6 is preferable from the viewpoint of achieving the range of preferable numbers of (meth)acryl groups contained in one molecule of a polyfunctional ethylenically unsaturated compound represented by the general formula (2) shown above and developing the flexibility, durability and surface abrasion resistance of printing plates.

The polyfunctional ethylenically unsaturated compound represented by the general formula (2) shown above is suitably a compound produced by an addition reaction of (meth)acrylating agents each composed of a (poly)pentaerythritol poly(meth)acrylate compound having a hydroxide group and/or a (meth)acrylate of a (poly)pentaerythritol alkylene oxide adduct having a hydroxide group, with a polyisocyanate. Such polyfunctional ethylenically unsaturated compounds include, for example, adducts of pentaerythritol tri(meth)acrylate and hexamethylene diisocyanate (hexafunctional), adducts of pentaerythritol tri(meth)acrylate and tolylene diisocyanate (hexafunctional), adducts of pentaerythritol tri(meth)acrylate and isophorone diisocyanate (hexafunctional), adducts of pentaerythritol tri(meth)acrylate and tolylene triisocyanate (nonafunctional), adducts of dipentaerythritol penta(meth)acrylate and hexamethylene diisocyanate (decafunctional), adducts of dipentaerythritol penta(meth)acrylate and tolylene triisocyanate (pentadecafunctional), adducts of dipentaerythritol penta(meth)acrylate and hexamethylene diisocyanate trimer (pentadecafunctional) and adducts of tripentaerythritol hepta(meth)acrylate and hexamethylene diisocyanate timer (heneicosafunctional), and these are suitably used.

As the urethane-based polyfunctional ethylenically unsaturated compound, other than the compounds represented by the general formula (2) shown above, suitably usable are compounds which are obtained by the addition reaction of compounds, such as hydroxypropyl (meth)acrylate, hydroxyethyl (meth)acrylate, polypropylene glycol mono(meth)acrylate, polyethylene glycol mono(meth)acrylate, glycerol mono(meth)acrylate, glycerol di(meth)acrylate, trimethylolpropane di(meth)acrylate, ditrimethylolpropane tri(meth)acrylate and pentaerythritol di(meth)acrylate, with the above-mentioned polyisocyanates, and whose (meth)acryloyl groups are adjusted to 6 or more.

Further, as the polyfunctional ethylenically unsaturated compound, also suitably usable are polyester oligomers being (meth)acrylates of polyhydric alcohols produced by a reaction of a polybasic acid and a polyhydric alcohol, (meth)acrylates of hyperbranched compounds (for example, hyperbranched polyester acrylate oligomers) obtained by incorporating (meth)acryloyl groups to active hydroxide groups of various types of hyperbranched compounds through a transesterification, compounds in which a compound having an isocyanate group and a (meth)acryloyl group in one molecule such as (meth)acryloyloxyethyl isocyanate is incorporated further with a (meth)acryloyl group through a urethanation reaction, and the like. These compounds are preferable from the viewpoint of solving effectively and securely the problems according to the present invention.

The hyperbranched compound is a compound having a hyperbranch structure. Here, "hyperbranch structure" refers to a chemical structure represented by repetition of a constituting unit being not a straight-chain or cyclic structure, but a radial or spherical structure.

A specific example of hyperbranched compounds includes a hyperbranched compound having polyvalent terminal hydroxide groups obtained from an oxetane compound having a four-membered ring ether structure (see Kudo, "Hybrid type Hyperbranched Polymer—Synthesis and Properties of Photofunctional Hyperbranched Polymer—", Kobunshi, The Society of Polymer Science, Japan, 2007, Vol. 56, May, pp. 334-337), and Bolton (registered trademark, dendritic polyester polyol, made by Perstorp Corp.) type H2003 (12-hydroxide type), type H2004 (6-hydroxide type), type H311 and type P500.

With respect to the above-mentioned polyfunctional ethylenically unsaturated compounds, from the viewpoint of suppressing development of tackiness in the case of repeatedly using produced printing plates, the following products can be preferably utilized as compounds having 6 or more (meth)acryloyl groups in one molecule, though details of their chemical structure are not clear.

Made by Daicel-Cytec Co., Ltd.; EBECRYL220, EBECRYL1290, KRM8200, EBECRYL5129, EBECRYL8301, EBECRYL450, EBECRYL1830, EBECRYL851, EBECRYL1870, and the like Made by San Nopco Ltd.; NOPCOMER4612, PHOTOMER5007, and the like Made by Shin-Nakamura Chemical Co., Ltd.; NK Oligo U-6HA, NK Oligo U-15HA, NK Oligo N-6A, and the like Made by Sartomer Co., Inc.; CN968, CN9006, CN9010, CN975, CN997, CN293, CN2297A, CN2300, CN2301, CN2302, CN2303, CN2304, and the like Made by Toagosei Co., Ltd.; Aronix M-1960, Aronix M-9050, and the like The content of such a polyfunctional ethylenically unsaturated compound in a photosensitive resin composition is 0.1 to 10 parts by mass, and preferably 1 to 5 parts by mass, with respect to 100 parts by mass of the component (a) described above. Making the content of a polyfunctional ethylenically unsaturated compound to be 0.1 part by mass or more is to improve the abrasion resistance of the printing plate surface. By contrast, making the content thereof to be 10 parts by mass or less is suitable from the viewpoint of satisfying the flexibility required for flexographic printing plates. The component (b) heretofore described is used singly or in combination of two or more.

The photopolymerization initiator of the component (c) described above includes, for example, benzoin, benzoin alkyl ethers such as benzoin ethyl ether, benzoin-n-propyl ether, benzoin isopropyl ether and benzoin isobutyl ether, 2,2-dimethoxy-2-phenylacetophenone, benzophenone, benzil, diacetyl, diphenyl sulfide and 9,10-anthraquinone. These are used singly or in combination of two or more.

Here, the component (c) is preferably used in combination with a sensitizer from the viewpoint of enhancing its reactivity. Such sensitizers include, for example, amines such as triethanolamine, methyldiethanolamine, triisopropanolamine, Michler's ketone, 4,4'-diethylaminophenone and ethyl 4-diethylaminobenzoate; and dyes such as eosine and thiosin. Particularly in the case of using a hydrogen abstract-type initiator such as benzophenone as the component (c) described above, such a sensitizer is preferably used.

The content of the component (c) described above in a photosensitive resin composition is 0.01 to 10 parts by mass, and preferably 0.1 to 5 parts by mass, with respect to 100 parts by mass of the component (a). Making the content of the component (c) in the range is suitable from the viewpoint of favorably balancing the storage stability, a desired photocuring rate, and the physical properties of resin cured products of a photosensitive resin composition.

A photosensitive resin composition according to the embodiment, according to need, can be blended further with thermal polymerization inhibitors, ultraviolet absorbents, optical stabilizers, dyes, pigments, lubricants, inorganic fillers, plasticizers and the like.

A liquid photosensitive resin composition according to the embodiment can be used also as a capping layer of a capped plate because it can develop excellent surface properties. That is, in a printing plate making method in which two or more resin compositions are laminated to make a formed body, and integrated by exposure, the liquid photosensitive resin composition according to the embodiment can be used as the capping layer located on the plate surface; and a liquid photosensitive resin by conventional technology can be used as a base resin taking the lower layer region.

Flexographic printing plates produced using a photosensitive resin composition according to the embodiment are favorably used especially as flexographic printing plates for corrugated boards, flexographic printing plates for common printing and flexographic printing plates for stamps.

The Shore A hardness, as measured at a temperature of 20° C. and a relative humidity of 70%, which is an index of the flexibility required for flexographic printing plates, is preferably 10 to 50, and more preferably 10 to 40. The hardness may properly be selected depending on materials to be printed on and required printing qualities. Setting the Shore A hardness at 10 or higher is suitable from the viewpoint of suppressing strains of reliefs against a printing pressure and reducing a risk of making character reading difficult because printed images become thick. By contrast, setting the Shore A hardness at 50 or lower is suitable from the viewpoint of fully transferring inks. The Shore A hardness is measured by the same method as described in Examples described later.

[Producing Method of a Flexographic Printing Plate]

A method for producing a flexographic printing plate according to the embodiment comprises the steps of the following (A) to (C).

(A) A cured site formation step of exposing a surface of a body formed from a photosensitive resin composition according to the embodiment to form a cured site within the surface of the formed body.

(B) A development step of developing the cured site with a wash out solution after the cured site formation step.

(C) An active light irradiation step (described as "post-exposure step" in some cases) of irradiating a surface of the developed cured site with active light after the development step.

The producing method of a flexographic printing plate may further comprise, after the step (C) described above, (D) a drying step of drying the cured site.

The step (A) is a step of irradiating a surface of a body formed from a photosensitive resin composition according to the embodiment with active light through a mask layer (for example, a negative film layer or a layer having an ablation layer formed by infrared laser or the like) provided on the surface to thereby selectively photocure sites where relief layers ace to be formed. The mask layer is disposed with such a shape that sites where relief layers of the formed body surface are to be formed can be selectively irradiated with the active light. The active-light sources used in the embodiment are preferably a low-pressure mercury lamp, a high-pressure mercury lamp, an ultraviolet fluorescent lamp, a carbon arc lamp, a xenon lamp, a zirconium lamp and solar light.

The step (A) may comprise a forming step in which the above-mentioned photosensitive resin composition is shaped into a certain thickness, like as a film, on a base material in the interior of a dedicated apparatus (platemaking machine). In this case, the step (A) may be referred to as a forming and exposure step.

Such a forming and exposure step includes, for example, the steps of the following (A1) to (A3).

(A1) A photosensitive layer forming step in which a negative film is mounted on an ultraviolet-transmissive glass plate (lower glass plate); the negative film is covered with a thin protection film; thereafter, a liquid photosensitive resin composition is cast thereon; a base film to become a support is laminated thereon through a spacer such that the photosensitive resin composition has a certain plate thickness; and further an ultraviolet-transmissive glass plate (upper glass plate) is pressed on the base film, thus forming a photosensitive layer. In the case where printing plates (a thickness of 4 mm or more) as used in corrugated board printing are formed, in order to complement the relief strength against printing pressure in printing, a shelf layer to become a foundation is preferably formed on the photosensitive layer portion on the upper glass plate side. In this case, before the relief exposure, a dedicated negative film (a masking film) is sandwiched between the upper glass plate and the base film to form the photosensitive layer.

(A2) A back exposure step, after the photosensitive layer forming step, in which a uniform, thin cured resin layer (that is, a floor portion forming layer (back deposited layer)) is deposited on the entire surface on the base film side of the plate by irradiation with active light (for example, light having a wavelength distribution of 300 nm or more) by an active-light source such as an ultraviolet fluorescent lamp from the upper glass plate side through the base film. In the case where the masking film is disposed in the photosensitive layer forming step, a shelf layer is formed by the similar exposure. In this case, the step is referred to as a masking exposure step.

(A3) A relief forming exposure step, after the back exposure step or the masking exposure step, in which the photosensitive layer is irradiated with the same active light as for the upper from the lower glass side through a negative film to form images.

In the case where the shelf layer is formed in the masking exposure step, one of preferable modes is to remove the masking film after the relief forming exposure step, and to be subjected further to the back exposure step to form a back deposited layer on the entire surface of the base film.

A wash out solution used in the step (B) described above is preferably a surfactant aqueous solution. Here, with respect to the kind and the composition of the surfactants, a surfactant optimum according to properties of a resin to be used is selected. Development methods are applicable, including a method in which a cured photosensitive resin plate obtained by exposure is immersed in a developing solution, a method in which a developing solution is sprayed on a cured photosensitive resin plate obtained by exposure from a spray nozzle, and a method in which an uncured resin swollen by the immersion or spray is scraped off with a brush.

The surfactant is preferably an anionic surfactant and/or a nonionic surfactant from the viewpoint of a wash out ability of micro portions and the endurance of a wash out solution.

The anionic components in the anionic surfactant include, for example, linear alkylbenzenesulfonates, α-olefin sulfonic acids, dialkyl sulfosuccinates, sulfonic acid of fatty acid lower alkyl ester, alkylsulfuric acids, alkyl ether sulfuric acids, saturated or unsaturated fatty acids and polyoxyalkylene addition products thereof. On the other hand, counter-cationic components to these anionic components include, for example, alkali metal ions such as sodium ions and potassium ions, and alkanolamine ions such as ammonium ions, monoethanolamine and diethanolamine.

The nonionic surfactants include, for example, polyoxyalkylene alkyl ethers, polyoxyalkylene alkenyl ethers, polyoxyalkylene alkylphenyl ethers, polyoxyalkylene alkenylphenyl ethers, polyoxyalkylene styrylphenyl ethers, polyoxyalkylene alkylamines, polyoxyalkylene alkenylamines, polyoxyalkylene alkylamides, polyoxyalkylene alkenylamides, and ethylene oxide/propylene oxide block addition products (Pluronic type surfactants).

The proportion of the surfactant in the wash out solution is preferably 0.2 to 4.0% by mass, and more preferably 0.5 to 3.0% by mass. Making the proportion to be 0.2% by mass or more is suitable from the viewpoint of securing the wash out ability enough to provide printing plates which can be used in printing. Making the proportion to be 4.0% by mass or less can contributes to reducing an action, exhibited by the surfactant having penetrated into the cured resin surface, of inhibiting the curing reaction by the post-exposure described later to reduce the tackiness of the printing plate surface.

The wash out solution is preferably blended with a hydrogen abstracting agent from the viewpoint of effectively reducing the tackiness of the printing plate surface. Here, "hydrogen abstracting agent" means a compound which can abstract hydrogen atoms in other compounds by irradiation with active light.

The proportion of such a hydrogen abstracting agent in the wash out solution is preferably 0.01 to 0.5% by mass, and more preferably 0.03 to 0.3% by mass. Making the proportion of 0.01% by mass or more is preferable from the viewpoint of favorably developing an effect of removing the surface tackiness. Making the proportion to be 0.5% by mass or less is suitable from the viewpoint of securing the wash out ability.

The hydrogen abstracting agents include, for example, benzophenones such as benzophenone, methyl o-benzoylbenzoate, 4-phenylbenzophenone, 4-chlorobenzophenone, 4-hydroxybenzophenone, 4-benzoyl-4'-methyldiphenyl sulfide, 3,3'-dimethyl-4-methoxybenzophenone, 4,4'-dichlorobenzophenone, 4-methylbenzophenone and 4,4'-dimethoxybenzophenon, anthraquinone, 2-methylanthraquinone, 2-ethylanthraquinone, 2,4-diethylthioxanthone, and 2-chlorothioxanthone. These are used singly or in combination of two or more. Above these all, benzophenones, particularly benzophenone, are suitably used from the viewpoint of having a high initiation efficiency of the hydrogen abstraction reaction for active light by an inexpensive germicidal lamp as an active light source and reducing a load on the wash out ability due to use of a hydrogen abstracting agent in a low concentration.

A surfactant is preferably selected prioritizing the wash out ability; and a hydrogen abstracting agent, prioritizing the reaction efficiency. Consequently, use of a wash out solution having a favorable wash out ability in a low concentration can achieve the permeation of a hydrogen abstracting agent into a resin cured product, and can achieve surface properties thereof more favorable for the post-exposure corresponding to little effect of shielding active light by a surfactant. In the case where the component (a) is a polyether polyester-based polyurethane prepolymer, use of a surfactant containing an alkali metal salt of a linear alkylbenzenesulfonic acid as a main component is especially preferable.

The wash out solution can be blended further with other optional components according to need. Such other optional components include, for example, alkanolamines such as monoethanolamine, diethanolamine and triethanolamine; builders such as citrates, phosphates and ethylenediaminetetraacetates; glycols such as ethylene glycol and propylene glycol, and lower alcohols such as methanol and ethanol, which are all to keep the liquid stability, and hydrotropy agents such as toluenesulfonates and xylenesulfonates; rust preventives such as benzotriazole; and preservatives such as benzoates.

The step (C) is a step in which after the development in the step (B), cured sites of a resin is irradiated with active light for the major purpose of promoting mechanical strengths of printing plates and removing the surface tackiness. As light sources of such active light (active-light source), preferably used are, for example, active-light sources (for example, a high-pressure mercury lamp, ultrahigh-pressure mercury lamp, ultraviolet fluorescent lamp, carbon arc lamp and xenon lamp) having a distribution of the wavelength region of 300 nm or higher used for relief exposure, active-light sources (for example, a low-pressure mercury lamp, a germicidal lamp and deuterium lamp) having a distribution of the wavelength region of 200 to 300 nm, and light sources thereof combined therewith.

Here, as a light source used in the case where the wash out solution contains a hydrogen abstracting agent, an active-light source is preferably selected which has a distribution of a wavelength region capable of effectively activating the hydrogen abstracting agent. In the embodiment, as described above, benzophenones are preferably used as a hydrogen abstracting agent. In this case, active-light sources having a distribution of a wavelength region of 200 to 300 nm are preferably used as light sources.

As exposure systems in the post-exposure step, employable are an in-water exposure system having the purpose of preventing the polymerization reaction inhibition by oxygen in the air, and an in-air exposure system in which the exposure is performed in the air, that is, no countermeasure to oxygen inhibition is taken. Above these all, an in-water exposure system is preferable from the viewpoint of favorably suppressing the development of tackiness due to abrasion of the plate surface.

The irradiation dose of the active light in the post-exposure step, in the case of using active light having a distribution of a wavelength region of 200 to 300 nm, is preferably 500 to 5,000 $mJ/cm^2$, more preferably 1,000 to 5,000 $mJ/cm^2$, and still more preferably 2,000 to 3,500 $mJ/cm^2$. Making the dose of active light irradiation 500 $mJ/cm^2$ or more is suitable from the viewpoint of sufficiently removing the surface tackiness and maintaining non-tackiness even in use in repeated printing. Making the irradiation dose of active light 5,000 $mJ/cm^2$ or less is suitable from the viewpoint of reducing a possibility of occurrence of tackiness caused by microcracks generated on the printing plate surface. The irradiation dose of active light in the embodiment is a value calculated from the irradiation intensity and the irradiation time at a wavelength of 250 nm as measured by an ultraviolet ray measurement device made by ORC Producing Co., Ltd., "UV-M02".

The step (D) is a step of drying moisture adhered to the surface of a cured photosensitive resin plate in the step (B) and the step (C) of the in-water exposure system. Drying in such a drying step is preferably carried out using a dedicated housing-type hot air drier.

The producing method of flexographic printing plates described above may further include other steps. For example, a printing plate making method disclosed in Japanese Patent No. 3592336 is suitably applicable which involves a step of making a hydrogen abstracting agent penetrate into a plate surface after the step (B) and then further carries out the step (C).

The tackiness of the surface of the flexographic printing plate described above right after the production has a value of the degree of tackiness, for tackiness evaluation described later, of preferably 50 g or lower, and more preferably 30 g or lower. Further, the tackiness of the printing plate surface after an abrasion test shown below has a value of the degree of tackiness of preferably 0 to 100 g, more preferably 0 to 75 g, and still more preferably 0 to 50 g. The degree of tackiness, indicating the tackiness of a printing plate surface after an abrasion test, of 100 g or lower is likely to suppress problems caused by paper dusts even after a printing plate is used in about 1,000,000 times of printing as a corrugated board printing plate.

The tackiness after an abrasion test described below is a tackiness reproducing a tackiness of the surface of a printing plate used for actual printing, and reproducing a tackiness of the plate surface after about 1,000,000 times of printing required by corrugated board print houses and the like.

Here, "degree of tackiness" is measured as follows in the embodiment.

[Tackiness Evaluation Right after the Production, and Tackiness Evaluation after the Abrasion Test]

(1) A flexographic printing plate 7 mm in thickness having a solid image (relief for printing whose entire surface is smooth and which has no dimple) region of 15-cm or more square and formed on a support (base film) is fabricated by a predetermined method. A disk of 10 cm in diameter is cut out from the flexographic printing plate, and a through-hole of 5 mm square is provided on the central part of the circular disk to obtain a sample plate.

(2) In order to evaluate the tackiness right after production of the printing plate, a tack tester (made by Toyo Seiki Seisaku-sho, Ltd.) is used. An adherend is prepared in which a polyester film is pasted on the circumferential surface of an aluminum circular disk 50 mm in diameter and 13 mm in thickness. The adherend is mounted on the sample plate such that the polyester film and the relief surface of the sample plate are contacted, and a load of 500 g is applied on the adherend and is allowed to stand for 4 sec. Thereafter, the adherend is pulled up at a rate of 30 mm per minute, and a tackiness force is read by a push pull gage at the moment when the adherend is separated from the relief surface. The measurement is conducted at four arbitrary points, and an integer in 10 g units near an arithmetic average of the tackiness forces at the four points is determined as a degree of tackiness (g) right after production of the printing plate.

(3) The abrasion test is conducted as follows. An abrasion ring, CALIBRADE® type H-38 (made by Taber Industries), is attached to the predetermined location of a Taber abrasion tester (made by Tester Sangyo Co., Ltd.); a load of 1 kg is installed on the arm; and the sample plate is set on the rotary table.

(4) As a probe solution to simulate the influence of an ink solvent on a plate surface, an aqueous solution composed of 16 parts by mass of diethylene glycol, 6 parts by mass of triethanolamine, 6 parts by mass of ethanol and 72 parts by mass of water is fabricated. The probe solution is dropped on the sample plate surface using a dropper so as to cover the entire sample plate surface.

(5) The abrasion ring attached to the abrasion tester is descended and mounted on the sample plate, and the sample plate is rotated at a rate of 60 rpm. At this time, since the probe solution is squeezed out from the doughnut-like region of the sample plate contacted with the abrasion ring and the amount of the probe solution between the abrasion ring and the sample plate decreases, the probe solution is again dropped with a dropper from above the abrasion ring once every one hundred times of rotation of the sample plate.

(6) The abrasion test is finished at the time when the sample plate has been rotated about fifteen hundred times; the probe solution adhered to the sample plate is wiped out with a nonwoven fabric; and the sample plate is dried in a drier at 60° C. for 10 min.

(7) The dried sample is allowed to stand in the air at room temperature for 30 min, and the temperature is decreased. With respect to the surface region of the sample plate on which the abrasion ring passed, by the same method as in (2) described above, the tackiness forces are measured at four arbitrary points, and an integer in 10 g units near the arithmetic average is determined as a degree of tackiness after the abrasion test.

The notch cracking resistance a flexographic printing plate has, as the notch cracking resistance indicated in the notch cracking resistance evaluation described below (a method according to a method described in Japanese Patent Application Laid-Open No. 04-95959), is preferably 20 sec. or more, more preferably 30 sec. or more, and still more preferably 45 sec. or more. Making the notch cracking resistance to be 20 sec. or more is suitable from the viewpoint of favorably achieving the durability required for corrugated board printing. That is, tiny scratches (notches) on the flexographic printing plate surface grow to breakage of the reliefs due to bending on handling the plate in some cases. Corrugated board printing plates are generally large and the degree of bending and warping on handling the plate is large. Therefore, in the case of using a flexographic printing plate as a corrugated board printing plate, the plate is required to have an especially favorable notch resistance. The region of the notch cracking resistance of 45 sec. or more exhibits a favorable durability to such a degree that a significant difference cannot be judged in practical use.

In order to make the notch cracking resistance to be 20 sec. or more, employable are a method in which as a polyurethane prepolymer of the component (a), a polymer having a number-average molecular weight in the range of 5,000 to 70,000 described before is selected; a method in which as a polyol relevant to the component (a), a polyester polyol is used; and a method in which a polyether diol and a polyester diol relevant to the component (a) each having a number-average molecular weight of 1,000 or higher are mixed and used in the range of a molar ratio (polyether diol/polyester diol) of 1/2 to 2/1.

Here, "notch cracking resistance" is measured as follows in the embodiment.

[Notch Cracking Resistance Evaluation]

(1) A flexographic printing plate 7 mm in thickness having a solid image (relief for printing whose entire surface is smooth and has no dimple) region 15 cm square or more and formed on a support (base film) is fabricated by a predetermined method. Three pieces of strip-like sample plates 2 cm in width and 5 cm in length are cut out from the flexographic printing plate, and a cut streak (notch) 0.8 to 1.2 mm in depth is made on the middle portion in the longitudinal direction of each of the sample plates with a cutter.

(2) Both the ends in the longitudinal direction of the sample plate are softly pinched between fingers of one hand such that the sample plate is slightly warped so that the cut streak is situated outward. One finger of the other hand is applied to the support such that the support located on the back side of the cut streak of the sample plate is bent right underneath the cut streak, and the sample plate is quickly bent and supported such that the bent support itself contacts closely and holds the shape.

(3) The time is measured in second units from the moment the sample plate is bent until a crack generated from the cut streak reaches the support.

(4) The same measurement is carried out about the three sample plates, and an integer in 5-second units near an arithmetic average of the measurement results is determined as a notch cracking resistance (sec).

EXAMPLES

Then, the embodiment will be described more specifically by way of Examples and Comparative Examples, but the embodiment is not limited to Examples described below without departing from the gist.

Production Example 1

Production of an Unsaturated Polyurethane Prepolymer A 2,000 g of a polyoxyethylene (EO)-oxypropylene (PO) block copolymer diol (hydroxyl value: 44 KOH mg/g, EO content: 30% by mass, hereinafter, abbreviated as "PL2500") was added with 40 ppm by mass of dibutyltin dilaurate (hereinafter, abbreviated as "BTL"); and the mixture was stirred at 40° C. until the mixture became homogeneous. The obtained mixture was added with 149 g of tolylene diisocyanate (hereinafter, abbreviated as "TDI"), and further stirred. When the mixture became homogeneous, the mixture was heated up to 80° C., and thereafter allowed to react for about 4 to 5 hours to prepare a prepolymer precursor having isocyanate groups at both terminals. The prepolymer precursor was added with 137 g of a poly(oxypropylene) glycol monomethacrylate (average molecular weight: 380, trade name: "PPM", made by NOF Corp.) and 69 g of hydroxypropyl methacrylate (trade name: "HP", made by NOF Corp.), and allowed to react for about 2 hours. A part of the reaction products in the obtained composition was taken out, and the isocyanate groups were confirmed to have vanished by an IR spectrometer. Thus, an unsaturated polyurethane prepolymer A was obtained.

The GPC measurement of the unsaturated polyurethane prepolymer A was conducted as described below, and the results were that macromolecules originated from the prepolymer components had a number-average molecular weight of 33,500, and that the composition had a content of the macromolecules of 93% by mass.

[GPC Measurement]

GPC measurement of the produced unsaturated polyurethane prepolymer was conducted under the following condition to determine the number-average molecular weight in terms of polystyrene. Further, using the peak area ratio (%) obtained in GPC measurement, the content of macromolecules originated from unsaturated polyurethane prepolymer components was determined excluding unreacted HP and PPM out of HP and PPM excessively added in producing.

Apparatus: "HLC-8220GPC", made by Tosoh Corp.
Column: "TSLgeIGMHXL", made by Tosoh Corp.
Solvent: tetrahydrofuran
Flow rate: 1 ml/min
Injection amount: 100 μl
Detector: RI detector
Standards for calibration curve: polystyrenes (molecular weights: 500 to 1,260,000)
Sample: 0.3-mass % tetrahydrofuran solution Production Example 2

Production of an Unsaturated Polyurethane Prepolymer B

A mixture of 900 g of a poly(propylene glycol adipate) diol (hydroxyl value: 44 KOH mg/g), and 1,100 g of PL2500 was added with 30 ppm by mass of BTL; and the mixture was stirred at 40° C. until the mixture became homogeneous. The obtained mixture was added with 155 g of TDI, and further stirred. When the mixture became homogeneous, the mixture was heated up to 80° C., and thereafter allowed to react for about 4 to 5 hours to prepare a prepolymer precursor having isocyanate groups at both terminals. The prepolymer precursor was added with 259 g of PPM and 136 g of HP, and allowed to react for about 2 hours. A part of the reaction products in the obtained composition was taken out, and the isocyanate groups were confirmed to have vanished by an IR spectrometer. Thus, an unsaturated polyurethane prepolymer B was obtained.

The GPC measurement of the unsaturated polyurethane prepolymer B was conducted as described above, and the results were that macromolecules originated from the prepolymer components had a number-average molecular weight of 21,000, and that the composition had a content of the macromolecules of 87% by mass.

Production Example 3

Production of an Unsaturated Polyurethane Prepolymer C

A mixture of 1,000 g of a poly(3-methyl-1,5-pentanediol adipate) diol (hydroxyl value: 37 KOH mg/g), and 1,000 g of PL2500 was added with 30 ppm by mass of BTL; and the mixture was stirred at 40° C. until the mixture became homogeneous. The obtained mixture was added with 144 g of TDI, and further stirred. When the mixture became homogeneous, the mixture was heated up to 80° C., and thereafter allowed to react for about 4 to 5 hours to prepare a prepolymer precursor having isocyanate groups at both terminals. The prepolymer precursor was added with 206 g of PPM and 181 g of HP, and allowed to react for about 2 hours. A part of the reaction products in the obtained composition was taken out, and the isocyanate groups were confirmed to have vanished by an IR spectrometer. Thus, an unsaturated polyurethane prepolymer C was obtained.

The GPC measurement of the unsaturated polyurethane prepolymer C was conducted as described above, and the results were that macromolecules originated from the prepolymer components had a number-average molecular weight of 23,000, and that the composition had a content of the macromolecules of 89% by mass.

Production Example 4

Production of a Polyfunctional Ethylenically Unsaturated Compound D

In a four-neck glass flask of 3 L in volume to which a reflux cooler, a water separator, an air introducing tube, a thermometer and a stirrer were attached, 203 g of methyl acrylate, 100 g of dipentaerythritol (purity: 95% or higher, made by Tokyo Chemical Industry Co., Ltd.), 6.3 g of 3-hydroxy-4-methyl-benzenesulfonic acid, 12.6 g of p-toluenesulfonic acid, 0.16 g of copper sulfate, and further 140 g of toluene as a solvent were charged. The mixture was stirred while nitrogen gas was blown in the flask, and heated at 100° C. for 2 hours. Thereafter, while the system interior was gradually depressurized and methanol produced by the transesterification and toluene as a solvent were distilled out, the reaction was performed finally at 200 mmHg for 6 hours. After the finish of the reaction, cleaning with an alkali aqueous solution and a neutralization operation were repeated to obtain an acrylate of dipentaerythritol as a reaction product.

An analysis by LC/MS measurement of the reaction product was conducted as described below, and the reaction product was then confirmed to contain dipentaerythritol hexaacrylate (molecular weight: 578) and dipentaerythritol pentaacrylate (molecular weight: 524) in a ratio (mass ratio) of 65 to 35. The reaction product was named as a polyfunctional ethylenically unsaturated compound D.

<LC/MS Measurement Condition>
1) LC (high-performance liquid chromatography) condition
  Sample: 7 mg/L (solvent: acetonitrile/water/methanol=55/30/15)
  Apparatus: "1100 series", made by Agilient Technologies
  Column: "Inertsil ODS-SP" (inner diameter 2.1 mm×length 150 mm), made by GL Sciences Inc.
  Column temperature: 40° C.
  Detection: UV 220 nm
  Flow rate: 0.2 mL/min
  Mobile-phase: distilled water (formic acid 0.05%) as liquid A, acetonitrile as liquid B, and liquid A/liquid B=90/10
  Mobile-phase gradient: 0 to 20 min; A/B=50/50, and 20 min; A/B=0/100
  Sample injection amount: 20
2) MS (Mass Spectroscopy) Condition
  Apparatus: "LCQ", made by Thermo Electron Corp.
  Ionization: ESI
  Mode: positive
  Scan range: m/z=150 to 2,000

Production Example 5

Production of a Polyfunctional Ethylenically Unsaturated Compound E

An acrylate of a polypentaerythritol was obtained as a reaction product as in Production Example 4, except for using dipentaerythritol (purity: 90%, made by Kanto Chemical Co., Ltd.) in place of dipentaerythritol (purity: 95% or higher, made by Tokyo Chemical Industry Co., Ltd).

LC/MS measurement of the reaction product was conducted, and the reaction product was confirmed to contain 3% by mass of pentaerythritol tetraacrylate (molecular weight: 352), 10% by mass of dipentaerythritol pentaacrylate (molecular weight: 524), 60% by mass of dipentaerythritol heptaacrylate (molecular weight: 578), 6% by mass of tripentaerythritol hexaacrylate (molecular weight: 750), 8% by mass of tripentaerythritol octaacrylate (molecular weight:

804), and additionally about 10% by mass of polymeric components having molecular weight distributions whose structures could not be identified. The reaction product was named as a polyfunctional ethylenically unsaturated compound E.

Production Example 6

Production of a Polyfunctional Ethylenically Unsaturated Compound F 500 g of dipentaerythritol (purity: 90%, made by Kanto Chemical Co., Ltd.), and 6 g of potassium hydroxide were charged in a high-pressure gas reaction facility; and after the facility interior atmosphere was replaced by nitrogen, the mixture was vacuum dehydrated at 120° C. for 60 min. Then, the mixture was heated to 100 to 130° C., and 685 g of propylene oxide was pressed into the facility spending about 8 hours. Thereafter, the reaction was continued for 2 hours at the same temperature until the volatile content became 0.1% or lower, and the reaction product was purified. Thus, a propylene oxide addition product of dipentaerythritol having 6 propylene oxides added in one molecule was obtained.

An acrylate of the dipentaerythritol propylene oxide addition product was obtained as a reaction product as in Production Example 4, except for using 235 g of the prepared propylene oxide addition product of dipentaerythritol in place of 100 g of dipentaerythritol (purity: 95% or higher, made by Tokyo Chemical Industry Co., Ltd.) in Production Example 4.

LC/MS measurement of the reaction product was conducted. The exact structural identification was difficult, but from the comparison with the LC spectrum of the polyfunctional ethylenically unsaturated compound B, the reaction product was presumed to mostly have a structure in which propylene oxides nearly of the predetermined amount was added to the polyfunctional ethylenically unsaturated compound B.

That is, the reaction product was a mixture containing as a main component a hexaacrylate (molecular weight: 926) of the dipentaerythritol propylene oxide addition product having 6 propylene oxides added in one molecule, and named as a polyfunctional ethylenically unsaturated compound F.

Example 1

The unsaturated polyurethane prepolymer A: 70 parts by mass, a methacrylate of an aliphatic alcohol (trade name: "Light Ester L-45", made by Yushiseihin Co., Ltd., hereinafter, abbreviated as "L-45"): 14 parts by mass, PPM: 14 parts by mass, the polyfunctional ethylenically unsaturated compound D: 1.8 parts by mass, 2,2-dimethoxy-2-phenylacetophenone (hereinafter, abbreviated as "DMPAP"): 0.6 parts by mass, and 2,6-di-t-butyl-p-crezol (hereinafter, abbreviated as "BHT"): 0.6 parts by mass were stirred and mixed under heating at 60° C. to obtain a liquid photosensitive resin composition.

Using the obtained liquid photosensitive resin composition, a flexographic printing plate was fabricated sequentially through a forming and exposure step, a development step, a post-development step and a drying step, shown below.

1) Forming and Exposure Step

A photosensitive layer provided with a shelf layer was formed as in (A1) described before, using the prepared liquid photosensitive resin composition. Then, using an ALF-213 type plate making machine (made by Asahi Kasei Chemical Corp.), the photosensitive layer was exposed as in (A2) and (A3) described before under the exposure conditions of a masking exposure dose of 500 mJ/cm$^2$ and a relief exposure dose of 650 mJ/cm$^2$ to obtain a cured photosensitive resin plate having a printing relief of 15 cm square and having a thickness of 7 mm.

2) Development Step

After the uncured resin was recovered by a conventional method, the cured photosensitive resin plate after exposure was developed using as a developing solution an aqueous solution containing 2% by mass of a wash out detergent APR™ type W-10 (base agent: an anionic surfactant, made by Asahi Kasei Chemicals Corp.), capable of emulsifying the photosensitive resin composition, and 0.3% by mass of a defoaming agent SH-4 (a silicone mixture, made by Asahi Kasei Chemicals Corp.). After the development was carried out at a solution temperature of 40° C. for a development time of 10 min. using an AL-400W type development machine (drum rotary spray type, made by Asahi Kasei Chemicals Corp., drum rotational speed: 20 rpm, spray pressure: 0.15 Pa), the developed plate was cleaned with tap water to such a degree that foams of the developing solution dropped off.

3) Post-exposure Step

The exposure was carried out by an in-water exposure system using an AL-200UP type post-exposure machine (made by Asahi Kasei Chemicals Corp.) equipped with both an ultraviolet fluorescent lamp and a germicidal lamp. The exposure was carried out for the exposure time such that the doses of exposure of the cured photosensitive resin plate surface to the respective light sources were 1,500 mJ/cm$^2$ for the ultraviolet fluorescent lamp and 4,500 mJ/cm$^2$ for the germicidal lamp.

4) Drying Step

The plate after the post-exposure was dried for about 30 min. until the moisture of its surface vanished using an ALF-DRYER (made by Asahi Kasei Chemicals Corp.). Thus, a flexographic printing plate was obtained.

Example 2

The unsaturated polyurethane prepolymer B: 75 parts by mass, L-45: 5 parts by mass, PPM: 9 parts by mass, diethylene glycol-2-ethylhexyl ether acrylate (trade name: Aronix M-120, made by Toagosei Co., Ltd., hereinafter, abbreviated as "M-120"): 9 parts by mass, the polyfunctional ethylenically unsaturated compound D: 2 parts by mass, DMPAP: 0.6 part by mass, and BHT: 0.6 part by mass were stirred and mixed under heating at 60° C. to obtain a liquid photosensitive resin composition.

A flexographic printing plate was fabricated using the obtained liquid photosensitive resin composition as in Example 1, except for using a developing solution obtained by further adding 0.5% by mass of an APR™ surfactant, type A-10 (a benzophenone/surfactant aqueous solution, made by Asahi Kasei Chemicals Corp.) to the developing solution in the development step, and altering the germicidal lamp irradiation exposure dose in the post-exposure step to 3,000 mJ/cm$^2$.

Example 3

The unsaturated polyurethane prepolymer C: 74 parts by mass, PPM: 12 parts by mass, M-120: 12 parts by mass, the polyfunctional ethylenically unsaturated compound D: 1.8 parts by mass, DMPAP: 0.6 part by mass, and BHT: 0.6 part by mass were stirred and mixed under heating at 60° C. to obtain a liquid photosensitive resin composition.

A flexographic printing plate was fabricated using the obtained liquid photosensitive resin composition as in Example 2.

Comparative Example 1

A liquid photosensitive resin composition was obtained and a flexographic printing plate was fabricated as in Example 1, except for using 2 parts by mass of trimethylolpropane trimethacrylate (trade name: "SR350J", made by Sartomer Co., Inc., hereinafter, abbreviated as "SR350J") in place of 1.8 parts by mass of the polyfunctional ethylenically unsaturated compound D.

Comparative Example 2

A liquid photosensitive resin composition was obtained and a flexographic printing plate was fabricated as in Example 2, except for using 1.0 part by mass of SR350J in place of 2 parts by mass of the polyfunctional ethylenically unsaturated compound D.

Comparative Example 3

A liquid photosensitive resin composition was obtained and a flexographic printing plate was fabricated as in Example 2, except for using 2.0 part by mass of SR350J in place of 2 parts by mass of the polyfunctional ethylenically unsaturated compound D.

Comparative Example 4

A liquid photosensitive resin composition was obtained and a flexographic printing plate was fabricated as in Example 3, except for using 2.0 parts by mass of SR350J in place of 1.8 parts by mass of the polyfunctional ethylenically unsaturated compound D.

Examples 4 to 12, and Comparative Examples 5 and 6

Liquid photosensitive resin compositions were obtained and flexographic printing plates were fabricated as in Example 3, except for using 1.8 parts by mass of the polyfunctional ethylenically unsaturated compounds shown below, respectively, in place of 1.8 parts by mass of the polyfunctional ethylenically unsaturated compound D.

Example 4: the polyfunctional ethylenically unsaturated compound E

Example 5: the polyfunctional ethylenically unsaturated compound F

Example 6: DPHA (trade name, made by Daicel-Cytec Co., Ltd., the content of dipentaerythritol hexaacrylate: 99% or higher)

Example 7: CN9010 (trade name, made by Sartomer Co., Inc., an aliphatic urethane acrylate oligomer, the number of functional groups: 6)

Example 8: CN975 (trade name, made by Sartomer Co., Inc., an aromatic urethane acrylate oligomer, the number of functional groups: 6)

Example 9: CN2301 (trade name, made by Sartomer Co., Inc., a hyperbranched polyester acrylate oligomer, the number of functional groups: 9)

Example 10: Urethane Light-Acrylate UA-510H (trade name, made by Kyoeisha Chemical Co., Ltd., a dipentaerythritol pentaacrylate hexamethylene diisosyanate urethane prepolymer, the number of functional groups: 10)

Example 11: NK Oligo U-15HA (trade name, made by Shin-Nakamura Chemical Co., Ltd., a three-branched urethane acrylate, the number of functional groups: 15)

Example 12: CN2304 (trade name, made by Sartomer Co., Inc., a hyperbranched polyester acrylate oligomer, the number of functional groups: 18)

Comparative Example 5: Light-Acrylate PE-4A (trade name, made by Kyoeisha Chemical Co, Ltd., pentaerythritol tetraacrylate)

Comparative Example 6: SR355 (trade name, made by Sartomer Co., Inc., ditrimethylolpropane tetraacrylate)

The viscosities of the obtained liquid photosensitive resin compositions and the hardnesses, degrees of tackiness, notch cracking resistances and the like of the obtained flexographic printing plates were evaluated.

With respect to Examples 1 to 3, and Comparative Examples 1 to 4, the compositions of the liquid photosensitive resins and the evaluation results are shown in Table 1. With respect to Examples 3 to 1.2 and Comparative Examples 5 and 6, whose compositions other than a polyfunctional ethylenically unsaturated compound are the same as one of those of Examples 1 to 3, the compositions of the liquid photosensitive resins and the evaluation results are shown collectively in Table 2.

TABLE 1

| | | Ex. 1 | Ex. 2 | Ex. 3 | Com. Ex. 1 | Com. Ex. 2 | Com. Ex. 3 | Com. Ex. 4 |
|---|---|---|---|---|---|---|---|---|
| Composition (parts by mass) | Unsaturated polyurethane prepolymer-A | 70 | — | — | 70 | — | — | — |
| | Unsaturated polyurethane prepolymer-B | — | 75 | — | — | 75 | 75 | — |
| | Unsaturated polyurethane prepolymer-C | — | — | 74 | — | — | — | 74 |
| | L-45 | 14 | 5 | — | 14 | 5 | 5 | — |
| | PPM | — | 9 | 12 | 14 | 9 | 9 | 12 |
| | M-120 | 14 | 9 | 12 | — | 9 | 9 | 12 |
| | SR350J | — | — | — | 2 | 1 | 2 | 2 |
| | Polyfunctional ethylenically unsaturated compound D | 1.8 | 2 | 1.8 | — | — | — | — |
| | DMPAP | 0.6 | 0.6 | 0.6 | 0.6 | 0.6 | 0.6 | 0.6 |
| | BHT | 0.6 | 0.6 | 0.6 | 0.6 | 0.6 | 0.6 | 0.6 |
| Evaluation results | Viscosity (Pa · s) | 70 | 75 | 87 | 68 | 75 | 74 | 87 |
| | Shore A hardness | 24 | 32 | 32 | 24 | 23 | 29 | 32 |
| | Plate surface tackiness degree after plate making (g) | 20 | 30 | 20 | 20 | 40 | 30 | 30 |
| | Plate surface tackiness degree after abrasion test (g) | 60 | 80 | 60 | 150 | 230 | 200 | 180 |
| | Notch cracking resistance (sec) | 25 | 35 | 40 | 25 | 50 | 40 | 40 |

TABLE 2

|  | Example | | | | | | | | | | Comparative Example | |
|---|---|---|---|---|---|---|---|---|---|---|---|---|
|  | 3 | 4 | 5 | 6 | 7 | 8 | 9 | 10 | 11 | 12 | 5 | 6 |
| Polyfunctional ethylenically unsaturated compound | D | E | F | DPHA | CN9010 | CN975 | CN2301 | UA-510H | U-15HA | CN2304 | PE-4A | SR355 |
| the Number of (Meth)acryloyl groups | 5-6 | 4-8 | 4-8 | 6 | 6 | 6 | 9 | 10 | 15 | 18 | 4 | 4 |
| Viscosity (Pa · s) | 87 | 87 | 90 | 87 | 91 | 72 | 90 | 103 | 91 | 87 | 88 | 89 |
| Shore A hardness | 32 | 32 | 29 | 33 | 32 | 34 | 27 | 27 | 28 | 27 | 35 | 34 |
| Plate surface tackiness degree after plate making (g) | 20 | 10 | 20 | 0 | 10 | 10 | 10 | 10 | 10 | 0 | 20 | 20 |
| Plate surface tackiness degree after abrasion test (g) | 60 | 50 | 60 | 40 | 50 | 60 | 50 | 50 | 60 | 40 | 90 | 80 |
| Notch cracking resistance (sec) | 40 | 40 | 50 | 40 | 40 | 30 | 55 | 55 | 50 | 50 | 10 | 5 |

(1) Viscosity

The obtained liquid photosensitive resin compositions were allowed to stand for one day in a constant temperature and humidity room of a temperature of 20° C. and a relative humidity of 70%, and measured for their viscosities in the room using a B type viscometer, B8H (made by Tokyo Keiki Co., Ltd.).

(2) Shore A Hardness

The obtained flexographic printing plates were allowed to stand for one day in a constant temperature and humidity room of a temperature of 20° C. and a relative humidity of 70%, and measured for their Shore A hardnesses of 15 cm-square image printing surfaces of the flexographic printing plates. The measurement was conducted at a load of 1 kg using a JIS Constant Loader GS-710 (made by TECLOCK Corp., according to ASTM D2240A, JIS K6253A and ISO 7619A) installed in the room, and values at 15 sec. after the start of the measurement were read.

(3) Degree of Tackiness

According to the method described before in "Tackiness evaluation right after the production, and tackiness evaluation after the abrasion test", the degree of tackiness of plate surfaces right after the production and the degree of tackiness of plate surfaces after the abrasion tests were measured.

(4) Notch Cracking Resistance

According to the method described before in "Notch cracking resistance evaluation", the notch cracking resistances were evaluated.

From the results of Examples and Comparative Examples described above, the following contents can be read.

(1) The flexographic printing plates obtained from the liquid photosensitive resin compositions of Examples 1 to 12 containing a polyfunctional ethylenically unsaturated compound of a structure having 6 or more (meth)acryloyl groups in one molecule achieve a degree of tackiness of 100 g or lower of plate surfaces after the abrasion tests, and a notch cracking resistance of 20 sec. or more.

(2) Examples 1 to 3, which used different unsaturated polyurethane prepolymers and a polyfunctional ethylenically unsaturated compound of a structure having 6 or more (meth)acryloyl groups in one molecule, and Comparative Examples 1 to 4, which used the different unsaturated polyurethane prepolymers, respectively, and trimethylolpropane trimethacrylate (trade name: "SR350J", made by Sartomer Co., Inc.) as the polyfunctional ethylenically unsaturated compound for the hardness adjustment, are compared. As the results, although the flexographic printing plates of Comparative Examples 1 to 4 achieved the notch cracking resistances in the same level as Examples 1 to 3, the degrees of tackiness of the plate surfaces after the abrasion tests exhibited values exceeding 100 g.

(3) the polyfunctional ethylenically unsaturated compounds used in Examples 3 to 12 have a structure containing 6 or more (Meth)acryloyl groups in one molecule from the information of their catalogues and MSDS's, and achieved a degree of tackiness of 100 g or less of plate surfaces after the abrasion tests, and a notch cracking resistance of 20 sec. or more.

(4) Comparative Examples 4 and 5 were examples using a four-functional monomer. These Comparative Examples achieved a degree of tackiness degree at the level of 100 g or less of plate surfaces after the abrasion tests, which could not be achieved if trimethylol propane trimethacrylate (trade name: "SR350J", made by Sartomer Co., Inc.) was used. However, these could not achieve a notch cracking resistance of 20 sec. or more, which was seen in the case of the polyfunctional ethylenically unsaturated compound having 6 or more (meth)acryloyl groups in one molecule.

(5) From the above results, in order to maintain the degree of tackiness of a plate surface after the abrasion test in a target level, it was clarified to be necessary to employ a polyfunctional ethylenically unsaturated compound. On the other hand, in order to sufficiently secure the durability as a flexographic printing plate, it was proved to be optimum that the polyfunctional ethylenically unsaturated compound has a molecular structure having 6 or more functional crosslinking points.

Example 13

A large-sized flexographic printing plate by a commercial design was fabricated. For the fabrication, an AWF plate making system (made by Asahi Kasei Chemicals Corp.), in which the forming exposure process of capped plates are automated, was used. The 7-mm flexographic printing plate for a corrugated board was produced under the conditions according to Example 4, except that a liquid photosensitive resin composition obtained as in Example 4 was applied in a thickness of 0.3 mm as a capping resin on a cover film; a liquid photosensitive resin composition obtained as in Comparative Example 3 was applied as a base resin on the capping resin; and thereafter, a supporter was laminated.

The obtained printing plate relief was combined with a design of a corrugated board printing, imposed, and provided to printing by a corrugated board production machine (corrugator). Use of the printing plate of this Example scarcely necessitated stopping a printing machine and cleaning the plate surface in a printing work of 30,000 to 40,000 prints/lot, and even at the times of printing number exceeding 1,200, 000, brought about few printing faults due to adhesion of paper dusts on the plate surface. The printing was carried out under the following conditions.

Corrugated board printing machine: Elan (made by Mitsubishi Heavy Industries, Ltd.)

Ink: an aqueous ink, viscosity: 8 to 9 sec/Zahn cup #4 (20° C.)

Corrugated sheet: A-Flute, surface sheet: 210 g/m², reinforced corrugating medium: 180 g/m²

Printing rate: 160 prints/min

Comparative Example 7

A printing evaluation was performed as in Example 13, except for using a monolayer plate (a plate produced from one kind of resin) using the liquid photosensitive resin composition obtained as in Comparative Example 2 in place of a capped plate. As a result, printing trouble was not observed at the beginning of printing work during repeated printing work of 30,000 to 40,000 prints/lot. However, at the times of printing number exceeding 300,000 or thereabouts, printing faults due to paper dusts adhered to the plate surface began to be noticeable. Further, with the times of printing number exceeding 500,000, printing was needed to be stopped for cleaning the plate several times in one lot, which clarified a large influence on productivity.

Comparative Example 8

Comparative Example 8 was an example to verify the advantage of the present invention about an aqueous developing solution composition for a photosensitive resin described in Japanese Patent Laid-Open No. 2004-317660. According to the contents described in examples of the Patent Document, a flexographic printing plate was fabricated from a plate-shaped photosensitive resin by a method described below and evaluated.

<Synthesis of a Hydrophilic Polymer>

An aqueous solution composed of 125 parts by mass of water and 3 parts by mass of Adeka Rea Soap SE1025 (trade name, made by Adeka Corp.) was prepared at 80° C. in a pressure-proof reaction vessel to which a stirring device and a jacket for regulating temperature were attached.

To the warm aqueous solution were added, under stirring, an oily mixture solution composed of 10 parts by mass of styrene, 70 parts by mass of butadiene, 13 parts by mass of 2-ethylhexyl acrylate, 5 parts by mass of methacrylic acid, 2 parts by mass of acrylic acid and 2 parts by mass of t-dodecylmercaptan, and an aqueous solution composed of 28 parts by mass of water, 1.2 parts by mass of sodium peroxodisulfate, 0.2 part by mass of sodium hydroxide and 1 part by mass of Adeka Rea Soap SE1025 (trade name, made by Adeka Corp.), at a constant flow rate spending 5 hours and 6 hours, respectively, and after 1 hour, the resulting product was cooled to obtain a copolymer latex.

The produced copolymer latex was neutralized; then, the unreacted monomers were removed by a steam stripping method; a gelatinous substance was filtered; and moisture was dried and removed to obtain a hydrophilic polymer.

<Fabrication of a Plate-shaped Photosensitive Resin Plate Material>

30 parts by mass of the above-mentioned hydrophilic polymer, 30 parts by mass of a styrene-butadiene block copolymer (trade name: "Kraton D-KX405", made by Kraton Polymers Japan), 30 parts by mass of a liquid polybutadiene (trade name: "B-2000", made by Nippon Petrochemicals Co., Ltd.), 3 parts by mass of dipentaerythritol hexaacrylate (trade name: "DPHA", made by Daicel-Cytec Co., Ltd.), 2 parts by mass of DMPAP and 1 part by mass of BHT were kneaded in a pressurized kneader at 140° C. to prepare a photosensitive resin composition.

Then, a polyester film (base film) one surface of which was coated with a thermoplastic elastomeric adhesive, and a polyester film (protection film) one surface of which was coated with a polyvinyl alcohol to a thickness of 5 μm were prepared. The coated surfaces of the respective films were arranged so as to be brought into contact with the photosensitive resin composition, and pressed at a temperature of 130° C. to form a plate-shaped photosensitive resin plate material of 7 mm in thickness.

<Fabrication of a Flexographic Printing Plate>

A flexographic printing plate was fabricated from the prepared plate-shaped photosensitive resin plate material by a method shown below.

1) Exposure Step

The prepared plate-shaped photosensitive resin plate material was exposed using an ultraviolet exposure machine, type JE-A2-SS (made by Nippon Denshi Seiki Co., Ltd.).

First, a back exposure of 2,000 mJ/cm² was carried out from the base film side; then, the polyester film being a base material of the protection film was peeled off; a negative film having an ultraviolet projection region of 15 cm square was closely contacted on the plate surface having the exposed polyvinyl alcohol surface; and a relief exposure of 6,000 mJ/cm² was carried out from above the negative film.

2) Wash Out Step

The unexposed portions were washed out at 50° C. with an aqueous solution containing 3% by mass of Newcoal 1008 (trade name, made by Sanyo Chemical Industries, Ltd.), 1% by mass of diethylene glycol dibutyl ether and 0.4% by mass of sodium carbonate, using a wash out machine, type JOW-A3-P (made by Nippon Denshi Seiki Co., Ltd.).

3) Drying Step

Drying was carried out for about 30 min. until the moisture of the plate surface vanished, using an ALF-DRYER (made by Asahi Kasei Chemicals Corp.).

4) Post-exposure Step

Using an AL-200UP post-exposure machine (made by Asahi Kasei Chemicals Corp.) equipped with an ultraviolet fluorescent lamp and a germicidal lamp, exposures were carried out in exposure times such that the doses of exposure to the respective light sources became 1,500 mJ/cm² for the ultraviolet fluorescent lamp and 3,000 mJ/cm² for the germicidal lamp on the plate-shaped cured photosensitive resin product surface.

<Evaluation Results of the Flexographic Printing Plate>

The obtained flexographic printing plate was evaluated similarly to the evaluations in Examples and Comparative Examples described above.

The Shore A hardness exhibited 41, and the notch cracking resistance exhibited 60 sec. or more.

Although the degree of tackiness after printing plate making exhibited 0 g in the evaluation of the degree of tackiness of the printing plate, in the abrasion test, occurrence of tacky foreign matters due to plate surface abrasion became remarkable after about one thousand times of rotation, so the experiment was finished.

From the experiment, it was verified that even use of dipentaerythritol hexaacrylate being a compound having 6 (meth) acryloyl groups in one molecule cannot provide an effect of suppressing abrasion of the printing plate surface in the photosensitive resin composition described in Japanese Patent Application Laid-Open No. 2004-317660.

Industrial Applicability

The photosensitive resin composition of the present invention can suitably be utilized especially in the field of a flexographic printing plate for corrugated boards.

The invention claimed is:

1. A photosensitive resin composition, comprising:
   100 parts by mass of a polyurethane prepolymer having an ethylenically unsaturated group;
   10 to 150 parts by mass of an ethylenically unsaturated compound; and
   0.01 to 10 parts by mass of a photopolymerization initiator,
   wherein said ethylenically unsaturated compound comprises 0.1 to 10 parts by mass of a polyfunctional ethylenically unsaturated compound having 6 or more (meth)acryloyl groups in a molecule thereof with respect to 100 parts by mass of said polyurethane prepolymer,
   wherein the polyurethane prepolymer is a reaction product of a polyurethane having isocyanate groups at its terminals, which is a reaction product of a polyol and a polyisocyanate, and a compound having an active hydrogen and an ethylenically unsaturated group in its molecule, or a reaction product of a polyurethane having hydroxyl groups at its terminals, which is a product of a polyol and a polyisocyanate, and a compound having an isocyanate group and an ethylenically unsaturated group in its molecule, and
   wherein said polyfunctional ethylenically unsaturated compound comprises a urethane-based polyfunctional ethylenically unsaturated compound obtained by reacting a polyisocyanate with (meth)acrylating agents.

2. A photosensitive resin composition, comprising:
   100 parts by mass of a polyurethane prepolymer having an ethylenically unsaturated group;
   10 to 150 parts by mass of an ethylenically unsaturated compound; and
   0.01 to 10 parts by mass of a photopolymerization initiator,
   wherein said ethylenically unsaturated compound comprises 0.1 to 10 parts by mass of a polyfunctional ethylenically unsaturated compound having 6 or more (meth)acryloyl groups in a molecule thereof with respect to 100 parts by mass of said polyurethane prepolymer,
   wherein the polyurethane prepolymer is a reaction product of a polyurethane having isocyanate groups at its terminals, which is a reaction product of a polyol and a polyisocyanate, and a compound having an active hydrogen and an ethylenically unsaturated group in its molecule, or a reaction product of a polyurethane having hydroxyl groups at its terminals, which is a product of a polyol and a polyisocyanate, and a compound having an isocyanate group and an ethylenically unsaturated group in its molecule, and
   wherein said polyfunctional ethylenically unsaturated compound comprises a compound represented by the general formula (2) shown below:

[Formula 2]

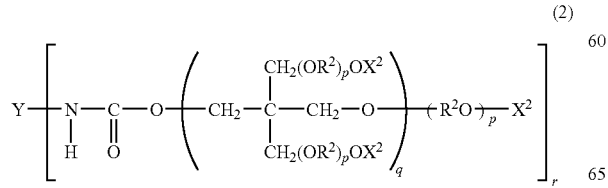

(2)

wherein $R^2$ denotes a divalent aliphatic saturated hydrocarbon group; $X^2$ denotes a (meth)acryloyl group, a hydrogen atom, or a monovalent aliphatic saturated hydrocarbon group; Y denotes a polyisocyanate residue; and p denotes an integer of 0 or 1 or more, q denotes an integer of 0 or 1 or more, and r denotes an integer of 2 or more; and wherein a plurality of $X^2$ may be the same or different, and 6 or more of them denotes (meth)acryloyl groups.

3. A photosensitive resin composition, comprising:
   100 parts by mass of a polyurethane prepolymer having an ethylenically unsaturated group;
   10 to 150 parts by mass of an ethylenically unsaturated compound; and
   0.01 to 10 parts by mass of a photopolymerization initiator,
   wherein said ethylenically unsaturated compound comprises 0.1 to 10 parts by mass of a polyfunctional ethylenically unsaturated compound having 6 or more (meth)acryloyl groups in a molecule thereof with respect to 100 parts by mass of said polyurethane prepolymer,
   wherein the polyurethane prepolymer is a reaction product of a polyurethane having isocyanate groups at its terminals, which is a reaction product of a polyol and a polyisocyanate, and a compound having an active hydrogen and an ethylenically unsaturated group in its molecule, or a reaction product of a polyurethane having hydroxyl groups at its terminals, which is a product of a polyol and a polyisocyanate, and a compound having an isocyanate group and an ethylenically unsaturated group in its molecule, and
   wherein said polyfunctional ethylenically unsaturated compound comprises a (meth)acryl compound having a urethane bond synthesized from one or two or more isocyanate compounds selected from the group consisting of tolylene diisocyanate, hydrogenated diphenylmethane diisocyanate, hexamethylene diisocyanate, isophorone diisocyanate, tolylene triisocyanate, triphenylmethane triisocyanate, 1,6,11-undecane triisocyanate, 1,3,6-hexamethylene triisocyanate, and hexamethylene diisocyanate trimer.

4. A flexographic printing plate comprising a cured product of a photosensitive resin composition comprising:
   100 parts by mass of a polyurethane prepolymer having an ethylenically unsaturated group;
   10 to 150 parts by mass of an ethylenically unsaturated compound; and
   0.01 to 10 parts by mass of a photopolymerization initiator,
   wherein said ethylenically unsaturated compound comprises 0.1 to 10 parts by mass of a polyfunctional ethylenically unsaturated compound having 6 or more (meth)acryloyl groups in a molecule thereof with respect to 100 parts by mass of said polyurethane prepolymer, and
   wherein the polyurethane prepolymer is a reaction product of a polyurethane having isocyanate groups at its terminals, which is a reaction product of a polyol and a polyisocyanate, and a compound having an active hydrogen and an ethylenically unsaturated group in its molecule, or a reaction product of a polyurethane having hydroxyl groups at its terminals, which is a product of a polyol and a polyisocyanate, and a compound having an isocyanate group and an ethylenically unsaturated group in its molecule, and
   wherein a relief depth of the printing plate is in a range from 2 mm to 7 mm.

5. A method for producing a flexographic printing plate according to claim 4, comprising:
the cured site formation step of exposing a surface of a body formed from a photosensensitive resin composition to form a cured site within the surface of said formed body;
the development step of developing said cured site with a wash out solution; and
the active light irradiation step of irradiating a surface of the developed cured site with active light,
wherein the photosensitive resin composition comprises:
100 parts by mass of a polyurethane prepolymer having an ethylenically unsaturated group;
10 to 150 parts by mass of an ethylenically unsaturated compound; and
0.01 to 10 parts by mass of a photopolymerization initiator,
wherein said ethylenically unsaturated compound comprises 0.1 to 10 parts by mass of a polyfunctional ethylenically unsaturated compound having 6 or more (meth)acryloyl groups in a molecule thereof with respect to 100 parts by mass of said polyurethane prepolymer, and
wherein the polyurethane prepolymer is a reaction product of a polyurethane having isocyanate groups at its terminals, which is a reaction product of a polyol and a polyisocyanate, and a compound having an active hydrogen and an ethylenically unsaturated group in is molecule, or a reaction product of a polyurethane having hydroxyl groups at its terminals, which is a product of a polyol and a polyisocyanate, and a compound having an isocyanate group and an ethylenically unsaturated group in its molecule, and
wherein a relief depth of the printing plate is in a range from 2 mm to 7 mm.

6. The flexographic printing plate according to claim 4, wherein said polyfunctional ethylenically unsaturated compound has 6 or more acryloyl groups in a molecule thereof.

7. The flexographic printing plate according to claim 4, wherein said polyfunctional ethylenically unsaturated compound comprises a compound represented by the general formula (1) shown below:

[Formula 1]

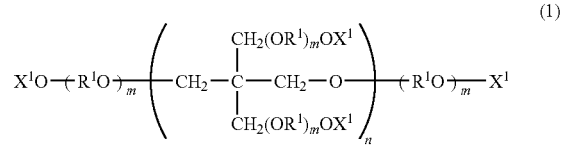

(1)

wherein $R^1$ denotes a divalent aliphatic saturated hydrocarbon group; $X^1$ denotes a (meth)acryloyl group, a hydrogen atom, or a monovalent aliphatic saturated hydrocarbon group; and m denotes an integer of 0 or 1 or more, and n denotes an integer of 2 or more; and wherein a plurality of $X^1$ may be the same or different, and 6 or more of them denotes (meth)acryloyl groups.

8. The flexographic printing plate according to claim 4, wherein said polyfunctional ethylenically unsaturated compound comprises one or two or more compounds selected from the group consisting of dipentaerythritol hexa(meth)acrylate, tripentaerythritol hepta(meth)acrylate, tripentaerythritol octa(meth)acrylate, and ethyleneoxide adducts and/or propyleneoxide adducts thereof.

9. The flexographic printing plate according to claim 4, wherein said polyfunctional ethylenically unsaturated compound comprises a urethane-based polyfunctional ethylenically unsaturated compound obtained by reacting a polyisocyanate with (meth)acrylating agents.

10. The flexographic printing plate according to claim 4, wherein said polyfunctional ethylenically unsaturated compound comprises a compound represented by the general formula (2) shown below:

[Formula 2]

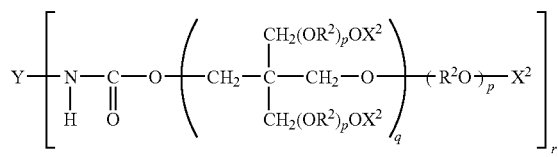

(2)

wherein $R^2$ denotes a divalent aliphatic saturated hydrocarbon group; $X^2$ denotes a (meth)acryloyl group, a hydrogen atom, or a monovalent aliphatic saturated hydrocarbon group; Y denotes a polyisocyanate residue; and p denotes an integer of 0 or 1 or more, q denotes an integer of 0 or 1 or more, and r denotes an integer of 2 or more; and wherein a plurality of $X^2$ may be the same or different, and 6 or more of them denotes (meth)acryloyl groups.

11. The flexographic printing plate according to claim 4, wherein said polyfunctional ethylenically unsaturated compound comprises a (meth)acryl compound having a urethane bond synthesized from one or two or more isocyanate compounds selected from the group consisting of tolylene diisocyanate, hydrogenated diphenylmethane diisocyanate, hexamethylene diisocyanate, isophorone diisocyanate, tolylene triisocyanate, triphenylmethane triisocyanate, 1,6,11-undecane triisocyanate, 1,3,6-hexamethylene triisocyanate, and hexamethylene diisocyanate trimer.

12. The flexographic printing plate according to claim 4, wherein said polyurethane prepolymer comprises a polyether polyester-based polyurethane prepolymer.

13. The flexographic printing plate according to claim 12, wherein said polyether polyester-based polyurethane prepolymer comprises a prepolymer obtained by reacting a reaction product of a polyol mixture containing a polyether polyol and a polyester polyol with a polyisocyanate, with a (meth)acrylating agent.

14. The flexographic printing plate according to claim 4, wherein said polyfunctional ethylenically unsaturated compound comprises a compound having a hyperbranched structure and/or a (meth)acrylate of a polyhydric alcohol.

15. The flexographic printing plate according to claim 4, wherein said ethylenically unsaturated group is a (meth)acryloyl group.

16. The flexographic printing plate according to claim 4, wherein said ethylenically unsaturated compound is one or more compounds selected from the group consisting of propylene glycol monomethacrylate, polyoxypropylene glycol monomethacrylate, diethylene glycol monoethyl ether mono (meth)acrylate, diethylene glycol monobutyl ether mono (meth)acrylate, diethylene glycol mono-2-ethylhexyl ether mono(meth)acrylate, triethylene glycol monohexyl ether mono(meth)acrylate, tetradecyl (meth)acrylate, pentadecyl (meth)acrylate, phenoxyethyl (meth)acrylate, N,N-diethylaminoethyl (meth)acrylate and polyoxypropylene glycol di(meth)acrylate.

17. The photosensitive resin composition according to any one of claims 1, 2 or 3, wherein said polyfunctional ethylenically unsaturated compound has 6 or more acryloyl groups in a molecule thereof.

18. The photosensitive resin composition according to any one of claims 1, 2 or 3, wherein said polyfunctional ethylenically unsaturated compound comprises a compound represented by the general formula (1) shown below:

[Formula 1]

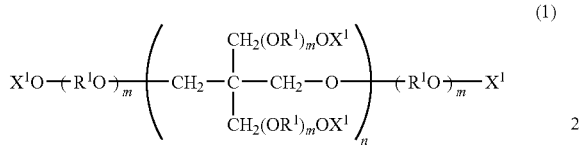

(1)

wherein $R^1$ denotes a divalent aliphatic saturated hydrocarbon group; $X^1$ denotes a (meth)acryloyl group, a hydrogen atom, or a monovalent aliphatic saturated hydrocarbon group; and m denotes an integer of 0 or 1 or more, and n denotes an integer of 2 or more; and wherein a plurality of $X^1$ may be the same or different, and 6 or more of them denotes (meth)acryloyl groups.

19. The photosensitive resin composition according to any one of claims 1, 2 or 3, wherein said polyfunctional ethylenically unsaturated compound comprises one or two or more compounds selected from the group consisting of dipentaerythritol hexa(meth)acrylate, tripentaerythritol hepta(meth)acrylate, tripentaerythritol octa(meth)acrylate, and ethyleneoxide adducts and/or propyleneoxide adducts thereof.

20. The photosensitive resin composition according to any one of claims 1, 2 or 3, wherein said polyurethane prepolymer comprises a polyether polyester-based polyurethane prepolymer.

21. The photosensitive resin composition according to claim 20, wherein said polyether polyester-based polyurethane prepolymer comprises a prepolymer obtained by reacting a reaction product of a polyol mixture containing a polyether polyol and a polyester polyol with a polyisocyanate, with a (meth)acrylating agent.

22. The photosensitive resin composition according to any one of claims 1, 2 or 3, wherein said polyfunctional ethylenically unsaturated compound comprises a compound having a hyperbranched structure and/or a (meth)acrylate of a polyhydric alcohol.

23. A flexographic printing plate comprising a cured product of a photosensitive resin composition according to any one of claims 1, 2 or 3.

24. A method for producing a flexographic printing plate, comprising:
a cured site formation step of exposing a surface of a body formed from a photosensitive resin composition according to any one of claims 1, 2 or 3 form a cured site within the surface of said formed body;
a development step of developing said cured site with a wash out solution; and
an active light irradiation step of irradiating a surface of the developed cured site with active light.

25. The method according to claim 24, wherein said wash out solution comprises a photosensitive hydrogen abstracting agent.

26. The method according to claim 25, wherein said active light has a distribution in a wavelength region of 200 nm to 300 nm; and said photosensitive hydrogen abstracting agent comprises benzophenone or a derivative thereof.

27. The photosensitive resin composition according to any one of claims 1, 2 or 3, wherein said ethylenically unsaturated group is a (meth)acryloyl group.

28. The photosensitive resin composition according to any one of claims 1, 2 or 3, wherein said ethylenically unsaturated compound is one or more compounds selected from the group consisting of propylene glycol monomethacrylate, polyoxypropylene glycol monomethacrylate, diethylene glycol monoethyl ether mono(meth)acrylate, diethylene glycol monobutyl ether mono(meth)acrylate, diethylene glycol mono-2-ethylhexyl ether mono(meth)acrylate, triethylene glycol monohexyl ether mono(meth)acrylate, tetradecyl (meth)acrylate, pentadecyl (meth)acrylate, phenoxyethyl (meth) acrylate, N,N-diethylaminoethyl (meth)acrylate and polyoxypropylene glycol di(meth)acrylate.

\* \* \* \* \*